US006243851B1

(12) United States Patent
Hwang et al.

(10) Patent No.: US 6,243,851 B1
(45) Date of Patent: Jun. 5, 2001

(54) HETEROGENEOUS METHOD FOR DETERMINING MODULE PLACEMENT IN FPGAS

(75) Inventors: L. James Hwang, Menlo Park; Eric F. Dellinger, San Jose; Sujoy Mitra; Sundararajarao Mohan, both of Cupertino; Cameron D. Patterson, Los Gatos; Ralph D. Wittig, Menlo Park, all of CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/049,892

(22) Filed: Mar. 27, 1998

(51) Int. Cl.[7] ............................ G06F 17/50; H03K 19/00; H03K 17/693
(52) U.S. Cl. ................................ 716/10; 716/21; 716/8; 716/9; 716/16; 716/17; 716/18; 716/121; 716/1; 717/8
(58) Field of Search .................... 395/500.11; 716/10

(56) References Cited

U.S. PATENT DOCUMENTS

| | | | |
|---|---|---|---|
| 4,554,625 | * 11/1985 | Otten | 364/148 |
| 4,918,614 | * 4/1990 | Modarres et al. | 364/490 |
| 5,311,443 | * 5/1994 | Crain et al. | 364/491 |

(List continued on next page.)

FOREIGN PATENT DOCUMENTS 2306728   5/1997   (GB) .

OTHER PUBLICATIONS

W.D. Smith eet al., Flexible Module Generation in the FACE design environment, IEEE Computer–Aided Design, pp. 396–399, Nov. 1988.*
D.W. Knapp et al., The ADAM Design planning engine, Computer–Aided Design of Integrated Circuits and Systems, pp. 829–846, Jul. 1991.*
J. Granacki et al., The ADAM advanced design automation system, ACM/IEEE conference on Design Automation, pp. 727–730, Apr. 1985.*
Wayne Wolf, An Object–Oriented, Procedural Database for VLSI Chip Planning, ACM/IEEE conference on Design Automation, pp. 744–751, Apr. 1986.*
M. Evered et al., Genja—A New Proposal for Parameterised Types in Java, Technology of Object–Oriented Languages and Systems, Nov. 1997, pp. 181–193.
M. Odersky et al., Leftover Curry and reheated Pizza: How functional programming nourishes software reuse, Fifth International Conference on, Jun. 1998, pp. 2–11.
B. Djafri et al., OOVHDL: Object Oriented VHDL, VHDL International Users' Forum, Oct. 1997, pp. 54–59.

(List continued on next page.)

*Primary Examiner*—Paul R. Lintz
*Assistant Examiner*—A. M. Thompson
(74) *Attorney, Agent, or Firm*—Lois D. Cartier; Julie Stephenson, ESQ; Bever, Hoffman & Harms

(57) ABSTRACT

The invention provides parametric modules called Self Implementing Modules (SIMs) for use in programmable logic devices such as FPGAs. The invention further provides tools and methods for generating and using SIMs. SIMs implement themselves at the time the design is elaborated, targeting a specified FPGA according to specified parameters. In one embodiment, a SIM references or includes one or more floorplanners each of which may employ one or more placement algorithms. Such placement algorithms might include, for example: a linear ordering algorithm that places datapath logic bitwise in a regular linear pattern; a rectangular mesh algorithm that implements memory in a grid pattern in distributed RAM; a columnar algorithm for counters and other arithmetic logic; or a simulated annealing algorithm for random logic such as control logic. Therefore, a design including more than one SIM can utilize a plurality of placement algorithms at the same or different levels of hierarchy. The design as a whole can therefore utilize a non-uniform global placement strategy.

30 Claims, 19 Drawing Sheets

U.S. PATENT DOCUMENTS

| | | | |
|---|---|---|---|
| 5,351,197 | * | 9/1994 | Upton et al. .................... 364/491 |
| 5,394,338 | * | 2/1995 | Shinohara et al. ................ 364/491 |
| 5,446,675 | * | 8/1995 | Yoshimura ....................... 364/489 |
| 5,491,640 | | 2/1996 | Sharma et al. .................... 364/488 |
| 5,499,192 | * | 3/1996 | Knapp et al. ..................... 364/489 |
| 5,519,627 | * | 5/1996 | Mahmood et al. ................ 364/488 |
| 5,519,630 | | 5/1996 | Nishiyama et al. ............... 364/490 |
| 5,568,395 | * | 10/1996 | Huang ............................... 364/489 |
| 5,594,657 | | 1/1997 | Cantone et al. ................... 364/490 |
| 5,602,754 | * | 2/1997 | Beatty et al. ...................... 364/489 |
| 5,612,893 | * | 3/1997 | Hao et al. .......................... 364/491 |
| 5,615,124 | * | 3/1997 | Hemmi et al. .................... 364/488 |
| 5,636,125 | * | 6/1997 | Rostoker et al. ............. 364/468.28 |
| 5,649,100 | | 7/1997 | Ertel et al. ......................... 709/225 |
| 5,696,693 | * | 12/1997 | Aubel et al. ....................... 364/490 |
| 5,754,441 | * | 5/1998 | Tokunoh et al. .................. 364/488 |
| 5,757,658 | * | 5/1998 | Rodman et al. ................... 364/491 |
| 5,828,588 | * | 10/1998 | Grant ............................. 364/718.04 |
| 5,838,165 | | 11/1998 | Chatter ................................ 326/38 |
| 5,838,583 | * | 11/1998 | Varadarajan et al. ............. 364/491 |
| 5,841,663 | * | 11/1998 | Sharma et al. .................... 364/490 |
| 5,892,678 | * | 4/1999 | Tokunoh et al. .................. 364/488 |
| 5,937,190 | | 8/1999 | Gregory et al. ................... 395/704 |
| 5,995,744 | | 11/1999 | Guccione .................... 395/500.44 |
| 6,080,204 | * | 6/2000 | Mendel ................................. 716/7 |

OTHER PUBLICATIONS

W. Wolf, How to Build a Hardware Description and Measurement System on an Object–Oriented Programming Language, IEEE Transactions on Computer–Aided Design, Mar. 1989, pp. 288–301.

P. Bellows et al., JHDL—An HDL for Reconfigurable Systems, IEEE Symposium on FPGAs for Custom Computing Machines, Apr. 1998, pp. 175–184.

D. W. Knapp et al., The ADAM Design Planning Engine, Computer–Aided Design of Integrated Circuits and Systems, Jul. 1991, pp. 829–846.

Yamazaki, Takao et al., A Top Down Design For Data Path Design, Proceedings of the Sixth Annual IEEE International ASIC Conference and Exhibit, pp. 266–269, Sep. 1993.*

Evolution User's Guide [online]. Morphologic., [retrieved on 1999–09–01]. Retrieved from the Internet http://www-.morphologic.com, Jan. 1998.*

Mencer, O. et al., PAM–Blox: High Performance FPGA Design For Adaptive Computing, FPGAs for Custom Computing Machines, 1998. Proceedings. IEEE SYmposium on., pp. 167–174, Apr. 1998.*

Kelem, S.H. et al., Shortening the Design Cycle for Programmable Logic, IEEE Design & Test of Computers, pp. 40–50, Dec. 1992.*

E. Gamma, R. Helm, R. Johnson, and J. Vlissides, Design Patterns, Addison Wesley (Textbook Request Pending), Jan. 1995.*

Usami, K. et al., Hierarchical Symbolic Design Methodology for Large–Scale Data Paths, IEEE Journal of Solid State Circuits, pp. 381–385, Mar. 1991.*

Engel, R. et al., Making Design Patterns Explicit in FACE, Proceedings of the 6th European Conference, pp. 94–110, Sep. 1997.*

N. Gelfand, Teaching Data structure Design Patterns, Proceedings of the 29th SIGCSE technical Symposium, pp. 331–335, Feb. 1998.*

Kortright, E.V., Modeling and simulation with UML and Java, Simulation Symposium, Proceedings., 30th Annual, pp. 43–48, Apr. 1997.*

Kelem, S.H. et al., Context–based ASIC Synthesis, Euro ASIC '92, Proceedings., pp. 226–231, Jun. 1992.*

Brasen, D.R., MHERTZ: A New Optimization Algorithm for Floorplanning and Global Routing, Design Automation Conference, 1990, Proceedings., 27th ACM/IEEE, Jun. 1990.*

Smith, William D. et al., Flexible Module Generation in the FACE Design Environment, IEEE International Conference on Computer–Aided Design, pp. 396–399, Nov. 1988.*

K. Bazargan et al., Nostradamus: A Floorplanner of Uncertain Designs, IEEE Transactions on Computer–Aided Design of Integrated Circuits and Systems, pp. 389–397, Apr. 1999.*

S. Tarafdar et al., Integrated Floorplanning in Data–Transfer Based High Level Synthesis, 1998 IEEE/ACM Conference on Computer–Aided Design, pp. 412–417, Nov. 1998.*

Lechner E. et al: "The Java Environment for Reconfigurable Computing" Field–Programmable Logic and Applications. 7th International Workshop, FPL '97. Proceedings, London, UK, Sep. 1–3, 1997, pp. 284–293, XP002086682 ISBN 3–540–63465–7, 1997, Berlin, Germany, Springer–Verlag, Germany.

Pottier B. et al: "Revisiting Smalltalk–80 blocks: a logic generator for FPGAs", Proceedings. IEEE Symposium on FPGAs for Custom Computing Machines (CAT. No. 96TB100063), Napa Valley, CA, USA, Apr. 17–19, 1996, pp. 48–57, XP002103589 ISBN 0–8186–7548–9, 1996, Los Alamitos, CA, USA.

Swamy S. et al.: "00–VHDL Object–Oriented Extensions to VHDL", Computer vol. 28, No. 10, Oct. 1, 1995, pp. 18–26 XP000535917.

Dekker R. et al. "HDL Synthesis for FPGA Design" Electronic Engineering, vol. 66, No. 814, Oct. 1, 1994, p. S43/44, 46 XP000471392.

Maxfield C: "LPMS: High–Level Design Uses Low–Level Techniques" EDN Electrical Design News, vol. 41, No. 10, May 9, 1996, pp. 125–131, XP00597964.

Hwang J. et al.: "Generating Layouts for Self–Implementing Modules", Field–Programmable Logic and Applications. From FPGAs to Computing Paradigm. 8th International Workshop, FPL, Aug. 31, 1998, pp. 525–529, XP002103590, ISBN 3–540–64948–4, 1998, Berlin, Germany, Springer–Verlag, Germany.

"The Programmable Logic Data Book" copyright Sep. 1996, pp. 4–5 through 4–78, Xilinx, Inc., 2100 Logic Drive, San Jose, CA 95124.

"XC4000 Family Hard Macro Style Guide", published Sep. 3, 1991 and available from Xilinx, Inc., 2100 Logic Drive, San Jose, CA 95124.

"Xilinx Libraries Guide", published Oct. 1995, pp. 4–71 to 4–97, available from Xilinx, Inc., 2100 Logic Drive, San Jose, CA 95124.

"X–BLOX User Guide", published Apr., 1994, pp. 1–1 to 2–14 and 4–36 to 4–46, available from Xilinx, Inc., 2100 Logic Drive, San Jose, CA 95124.

"CORE Solutions Data Book", copyright 1997, pp. 4–3 to 4–4 and 2–3 to 2–91, available from Xilinx, Inc., 2100 Logic Drive, San Jose, CA 95124.

"Automated Layout of Integrated Circuits", pp. 113–195 of "Design Systems for VLSI Circuits", edited by G. De Micheli, A. Sangiovanni–Vincentelli, and P. Antognetti, published 1987, by Martinus Nijhoff Publishers.

Mohanty et al., "SCUBA: An HDL Data–Path/Memory Module Generator for FPGAs," IEEE, pp. 135–142.

Andersson et al.,"Interaction Semantics of a Symbolic Layout Editor for Parameterized Modules," IEEE, pp. 1096–1106.

Kim et al., "An Analog Layout Floorplanner Using its Parameterized Module Layout Structure," IEEE, pp. 397–400.

Tsareff et al.,"An Expert System Approach to Parameterzied Module Synthesis," IEEE, pp. 28–36.

* cited by examiner

```
class X4keAdderxWReg  extends Sim {
    int sampleWidth; // data width in bits // the constructor for the SIM
    X4keAdderxWReg(String instanceName, int sampleWidth,
            Net a, Net b, Net clk, Net ce, Net clr, Net sum) {
        setName(instanceName);
        this.sampleWidth = sampleWidth;
        // add ports
        addPort("a", Port.IN, sampleWidth, a);
        addPort("b", Port.IN, sampleWidth, b);
        addPort("sum", Port.OUT, sampleWidth+1, sum);
        // add nets
        Net cy = addNet("cy", sampleWidth);
        Net clsum = addNet("clsum", sampleWidth+1);
        // add child SIMs
        for (int i = 1; i <= (sampleWidth-1)/2; i++) {
            addSim(new CY4("bits_"+i, "ADD-FG-CI",
                getRipNet(getPortNet("a"), sampleWidth-2*i-1), // a0
                getRipNet(getPortNet("b"), sampleWidth-2*i-1), // b0
                getRipNet(getPortNet("a"), sampleWidth-2*i),   // a1
                getRipNet(getPortNet("b"), sampleWidth-2*i),   // b
                null, // addsub
                getRipNet(cy, sampleWidth-2*i-1), // ci
                getRipNet(cy, sampleWidth-2*i),   // co0
                getRipNet(cy, sampleWidth-2*i+1)  // co
                //more code here
                // . . .
                ));
        }
    }
}
```

FIG. 2

```
public void addAllParams() {
    addParam("InstanceName", getName()); // String Param
    addParam("widthA", this.widthA); // Integer Param
    addParam("widthB", this.widthB); // Integer Param
    addParam("twosCompA", true); // Boolean Param
    addParam("twosCompB", true); // Boolean Param
    Vector tmpVec = new Vector(); // Vector of choices
    tmpVec.addElement("Area"); // Choice Element
    tmpVec.addElement("Speed"); // Choice Element
    addParam("Area vs Speed", tmpVec, 0); // Choice Param
}
```

FIG. 4

```
public String checkParams() {
  int newWidthA = getParamInt("widthA");
  int newWidthB = getParamInt("widthB");
  if (newWidthA < 2 || newWidthA > 128)
     return ("widthA should be between 2 and 128");
     // error message
  else {
     setPortWidth("inputA", widthA);
     setPortWidth("inputB", widthB);
     setPortWidth("output", widthA+widthB);
     boolean tmpboolval = getParamBoolean("twosCompA");
     if (twosCompA != tmpboolval) {
         twosCompA = tmpboolval;
         updateImplem = true;
     }
  } //  end else block
  return null; // no error
}
```

FIG. 5

```
public boolean updateImplementation() {
   if (updateImplem) { // internal flag set by checkParams()
      PlaceInfo tmpPlaceInfo = getPlaceInfo();
      deleteAll(); // delete the current structure
      implement(...); // do something with tmpPlaceInfo
      return true;
   }
   else
      return false;
}
```

FIG. 6

```
public X4keCy41Adder (String instanceName,
      // placement parameters
      int rowOffset, int colOffset,
      // number of bits, determines widths of nets
      int size,
      // the nets
      Net a, Net b, Net sum, Net ci, Net addsub
) { ... }
```

FIG. 7

```
public X4keCy4Elem(String instanceName, int rowOffset,
                int colOffset, Net a, Net b, Net sum,
                Net cin, Net cout0, Net cout, Net add) {
    super(Family.X4KE, rowOffset, colOffset);
      // ImplementedSim constructor
    setName(instanceName);

a = addPort("a", Port.IN, 2, a);
    b = addPort("b", Port.IN, 2, b);
    sum = addPort("sum", Port.OUT, 2, sum);
    cin = addPort("cin", Port.IN, 1, cin);
    cout0 = addPort("cout0", Port.OUT, 1, cout0);
    cout = addPort("cout", Port.OUT, 1, cout);
    add = addPort("add", Port.IN, 1, add);
    addSim(new CY4(instanceName+"/cy4",
            rowOffset, colOffset,
            "ADDSUB-FG-CI",
            getRipNet(a, 0),
            getRipNet(b, 0),
            getRipNet(a, 1),
            getRipNet(b, 1),
            add,
            cin,
            cout0,
            cout));
    addSim(new EQN(instanceName+"/fmap0",
            rowOffset, colOffset, "f",
            "((~d)*(a@b@c))+(d*(a@(~b)@c))",
            cin,
            getRipNet(a, 0),
            getRipNet(b, 0),
            add,
            getRipNet(sum, 0)));
    addSim(new EQN(instanceName+"/fmap1",
            rowOffset, colOffset, "g",
            "((~d)*(a@b@c))+(d*(a@(~b)@c))",
            cout0,
            getRipNet(a, 1),
            getRipNet(b, 1),
            add,
            getRipNet(sum, 1)));
}
```

FIG. 8

```
public void addAllParams() {
    addParam("inwidth", 16);
    addParam("num_bits", 12);
    addParam("outwidth", 5);
}
```

FIG. 9

```
public add_tree() {
    addAllParams();
    addPort("inbits", Port.IN, 0);  // port width set later
    addPort("sum", Port.OUT, 0);
    addPort("clk", Port.IN, 1);  // port width known, set now
}
```

FIG. 10

```
public void setPortWidths() {
    setPortWidth("inbits", getParamInt("num_bits"));
    setPortWidth("sum", getParamInt("outwidth"));
}
```

FIG. 11

```
                                                                    1200
void implement(String family, int row, int col, String locstr) {
    placeAt(row, col, locstr); // set the placement info
    // create local nets, initialize local variables // instantiate a new HDLSim called adre2
    adre2 small_adder = new adre2();

// set all the parameters of the new HDLSim
    small_adder.setName("outer_loop_"+j+"small_adder");
    small_adder.setParam("w", opsize);
    small_adder.setParam("ow", opsize);

// tell the HDLSim to create its structure
    addHDLSim(small_adder);

// connect nets to the HDLSim
    small_adder.connectNet("a", getPortNet("inbits"));
    small_adder.connectNet("sum", getPortNet("sum"));
    // some other code
}
```

FIG. 12

```
                                                        1300
class Output() {
    public Output() {
        // some code
        netlist = new Netlist(thisSim, Output.XNF, needNames);
        // some other code
    }
}
```

FIG. 13

```
class PlaceInfo
{
    private Sim   peerSim;         // the corresponding SIM
    private int   rowoffset;       // the SIM's current row-offset
                                   // in its H_SET
    private int   coloffset;       // the SIM's current col-offset
                                   // in its H_SET private Implementation implementation; // the current
                                           // implementation private Vector implementations;
    private Vector constraints;

public Implementation currentImplementation()
    { return implementation; } public void addImplementation(Implementation i)
    { implementations.addElement(i); } public void addImplementation()
    { implementations.addElement(currentImplementation()); } public void addConstraint(Constraint c)
    { constraints.addElement(c); } public Enumeration implementations()
    { return implementations.elements(); } public Enumeration constraints()
    { return constraint.elements(); }

// other fields and methods
}
```

FIG. 14

```
public class Implementation
{
    /**
     * constructor
     * <P>
     * Build an implementation object for the SIM's current
     * implementation.
     * The implementation encapsulates the layout of the entire
     * SIM (i.e. of the SIM's entire subtree).
     * @param   sim   sim whose implementation we want to save
     */
    public Implementation(Sim s) {}   // code omitted /**
     * restore this implementation to the SIM
     * @return true if successful
     */
    public boolean restore() {return false;}
}
```

FIG. 15

```
/**
 * Marker base class for constraints.
 * Contains no data or methods; used only to define a base
 * Constraint type.
 */
public class Constraint {}

/**
 * Region constraint type.  Defines a rectangular device region
 * in which a SIM and subtree should be placed.
 */
public class RegionConstraint extends Constraint
{
    public TileLocExtrema box;     // a rectangle in device
                                   // coordinates
    public TileMatrix blockages;   // defines set of resource
                                   // used within the box
}
```

FIG. 16

```
                                                    ┌─ 1700
┌─────────────────────────────────────────────────────┴──────┐
│ abstract public class Planner                              │
│ {                                                          │
│       private     Sim sim_;                                │
│       public      Sim getSim()   { return sim_; }          │
│                                                            │
│       public     PlaceInfo getPlaceInfo()                  │
│       { return getSim().getPlaceInfo(); }                  │
│                                                            │
│       // register SIM with planner and vice versa          │
│       public boolean setSim(Sim s)   {                     │
│             if (null == s) return false;                   │
│             sim_ = sim;                                    │
│             s.getPlaceInfo().setPlanner(this);             │
│             return true;                                   │
│       }                                                    │
│                                                            │
│       abstract public boolean execute();                   │
│       // execute the planner                               │
│ }                                                          │
└────────────────────────────────────────────────────────────┘
```

FIG. 17

```
/**
 * Planner to try every implementation, selecting the one with
 * the best score.
 */
public class EnumeratePlanner extends Planner
{
    private Scorer score_;
    public EnumeratePlanner(Scorer score) { score_ = score; } public boolean execute()
    {
        float bestscore = MAX_FLOAT;
        Implementation best = null;

Enumerations imps =
            getSim().getPlaceInfo().implementations();
        while (imps.hasMoreElements()) {
            Implementation imp =
                (Implementation) imps.nextElement();
            if (false == imp.restore()) continue;
            float s = score_.compute(getSim());
            if (s < bestscore) {
                best = imp;
                bestscore = s;
            }
        }
        if (null != best)
            return best.restore();
        else return false;
    }
}
```

```
/**
 * Planner to lay out peer SIM's children in a row.
 */
public class RowPlanner extends Planner
{
    private int from_direction = Constants.FROM_LEFT;

private TileLoc loc_ = new TileLoc(0, 0);

public RowPlanner(int from_direction)
    {
        this.from_direction(from_direction);
    }

/**
     * set the from location for this row
     * @param    loc    new location
     */
    public void setLoc(Tileloc loc) { loc_ = loc; }
    public TileLoc getLoc() { return loc_; }

/**
     * get the from direction for this row
     * @return from direction
     */
    public int from_direction() { return from_direction; }

/**
     * set the from direction for this row
     * @param    dir    new from direction
     */
    public void from_direction(int dir)
    {
        if (Constants.FROM_LEFT == dir
            || Constants.FROM_RIGHT == dir)
            from_direction = dir;
    }
}
```

FIG. 19

```
/**
 * Reorder the simGroup children in the desired order
 * for the VectorTemplate
 */
public boolean orderSimGroups()
{ //code omitted
} public boolean execute()
{
    PlaceInfo pi = getSim().getPlaceInfo();
    Implementation prev = saveCurrentImplementation();

if (!orderSimGroups())
        return false;

VectorTemplate row =
        pi.getPeerSimGroup()
            .applyVectorTemplate(Constants.ROW);
    row.rowDirection(from_direction);
    TileMatrix context = pi.getContext();
    if (false ==
        row.recordResources(loc.col, loc.row, context))
    {
        prev.restore();
        return false;
    }
    return true;
}
}
```

FIG. 20

```
/**
 * Planner that places the peer SIM's children using simulated
 * annealing.
 * Assumes SIM hierarchy has been flattened so that the SIM's
 * children are the moveable objects.
 */
public class AnnealerPlanner
{
    public boolean execute()
    {
    // perform simulated annealing subject to the constraints
    // on the peer SIM.
    // In particular, restrict placement to the SIM's region.
    }
}
```

FIG. 21

```
public class MetaPlanner extends Planner
{
    // set of planner objects
    protected Vector planners;

public void addPlanner(Planner p) { planners.addElement(p); }
    public boolean deletePlanner(Planner p)
    {
        return (null != planners.delete(p));
    }

/**
     * compute a number of implementations using all registered
     * planners
     * add the resulting to the SIM's PlaceInfo object.
     */
    public boolean execute()
    {
        boolean val = false;
        Enumeration pe = planners.elements();
        while (pe.hasMoreElements()) {
            Planner p = (Planner) pe.nextElement();
            if (false == p.execute()) continue;
            val = true;
            getSim().getPlaceInfo().addImplementation();
        }
        return val;
    }
}
```

FIG. 22

```
public class TopLevelPlanner extends Planner
{
    // return planner that lays out SIM A
    private Planner getSimAPlanner();

// return annealing planner that lays out Control SIM
    // interspersed with SIM A
    private Planner getControlSimPlanner();

public boolean execute()
    {
        Planner planner = getSimAPlanner();
        if (false == planner.execute()) return false;

planner = getControlSimPlanner();
        if (false == planner.execute()) return false;
        return true;
    }
}
```

FIG. 25

```
class SystolicArraySim extends SIM implements Mesh2DSimInterface
{
    SystolicArraySim( // various parameters for the constructor
                    int numRows, int numCols,
                    // other parameters) {
        initMesh(numRows, numCols);   // create the mesh
        for (int i = 0; i < numRows; i++)
            for (int j = 0; j < numCols; j++)
                setElementAt(i, j, new SomeSim( ... ));
                // create new child SIM and place it at a
                // mesh location
            updateConnections(); // do all the routing
    }
}
```

FIG. 26

HETEROGENEOUS METHOD FOR DETERMINING MODULE PLACEMENT IN FPGAS

CROSS-REFERENCE TO RELATED APPLICATIONS

This application relates to the following concurrently filed, commonly assigned U.S. patent applications:

Ser. No. 09/049,891 invented by Eric F. Dellinger, L. James Hwang, Sujoy Mitra, Sundararajarao Mohan, and Ralph D. Wittig, entitled "CONTEXT-SENSITIVE SELF IMPLEMENTING MODULES", Ser. No. 09/049,518 invented by Sundararajarao Mohan, Eric F. Dellinger, L. James Hwang, Sujoy Mitra, and Ralph D. Wittig, entitled "FPGA MODULES PARAMETERIZED BY EXPRESSIONS", Ser. No. 09/049,675 invented by Sundararajarao Mohan, Eric F. Dellinger, L. James Hwang, Sujoy Mitra and Ralph D. Wittig entitled "METHOD FOR SPECIFYING ROUTING IN A LOGIC MODULE", and Ser. No. 09/049,598 invented by Cameron D. Patterson, Eric F. Dellinger, L. James Hwang, Sujoy Mitra, Sundararajarao Mohan, and Ralph D. Wittig entitled "METHOD FOR CONSTRAINING CIRCUIT ELEMENT POSITIONS IN STRUCTURED LAYOUTS", which are incorporated herein by reference.

BACKGROUND OF THE INVENTION

1. Field of the Invention

The invention relates to programmable integrated circuits (ICs). More particularly, the invention relates to parametric logic modules for implementing designs in programmable ICs, and software tools and methods for creating such modules.

2. Description of the Background Art

Programmable ICs are a well-known type of digital integrated circuit that may be programmed by a user to perform specified logic functions. One type of programmable IC, the field programmable gate array (FPGA), typically includes an array of configurable logic blocks (CLBs) surrounded by a ring of programmable input/output blocks (IOBs). The CLBs and IOBs are interconnected by a programmable interconnect structure. The CLBs, IOBs, and interconnect structure are typically programmed by loading a stream of configuration data (bitstream) into internal configuration memory cells that define how the CLBs, IOBs, and interconnect structure are configured. The configuration data may be read from memory (e.g., an external PROM) or written into the FPGA by an external device. The collective states of the individual memory cells then determine the function of the FPGA.

One such FPGA, the Xilinx XC4000™ Series FPGA, is described in detail in pages 4–5 through 4–78 of the Xilinx 1996 Data Book entitled "The Programmable Logic Data Book" (hereinafter referred to as "the Xilinx Data Book"), published September, 1996, available from Xilinx, Inc., 2100 Logic Drive, San Jose, Calif. 95124, which pages are incorporated herein by reference. (Xilinx, Inc., owner of the copyright, has no objection to copying these and other pages referenced herein but otherwise reserves all copyright rights whatsoever.)

As FPGA designs increase in complexity, they reach a point at which the designer cannot deal with the entire design at the gate level. Where once a typical FPGA design comprised perhaps 5,000 gates, FPGA designs with 20,000 gates are now common, and FPGAs supporting over 100,000 gates will soon be available. To deal with this complexity, circuits are typically partitioned into smaller circuits that are more easily handled. Often, these smaller circuits are divided into yet smaller circuits, imposing on the design a multi-level hierarchy of logical blocks. The imposition of hierarchy makes it possible to implement designs of a size and complexity that would otherwise be unmanageable.

True hierarchical design is difficult to achieve for FPGAs using currently-available software. Designs can be entered hierarchically (e.g., via schematic entry or Hardware Description Languages (HDLs)), but mapping, placement and routing software typically "flattens" the design. It is desirable to retain the hierarchy as long as possible through the mapping, placement, and routing stages of implementing the design. The advantages of maintaining a hierarchy include faster software (because fewer objects at a time require manipulation), ease of changing the design (because only a discrete portion of the total logic has to be changed), and ease of doing incremental design (retaining a portion of a design while remapping, replacing, and rerouting only the part of the design that has been changed).

One result of the "hierarchical advantage" is the development of "module libraries", libraries of predeveloped blocks of logic that can be included in a hierarchy of logical blocks. A higher-level block incorporating (instantiating) a second module is called a "parent" of the instantiated module. The instantiated module is called a sub-module or "child" of the parent. Such library modules include, for example, adders, multipliers, filters, and other arithmetic and DSP functions from which complex designs can be readily constructed. The use of predeveloped logic blocks permits faster design cycles by eliminating the redesign of duplicated circuits. Further, such blocks are typically well tested, thereby making it easier to develop a reliable complex design.

To offer the best possible performance, some library modules have a fixed size and shape with relative location restrictions on each element. One such module type (now obsolete) was the "hard macro" from Xilinx, Inc. Hard macros are described in the "XC4000 Family Hard Macro Style Guide", published Sep. 3, 1991 and available from Xilinx, Inc., which is incorporated herein by reference in its entirety. A hard macro did not require schematics; instead, it included a schematic symbol that was used to include the macro in a customer design, and a netlist referenced by the schematic symbol and representing the macro circuitry. The netlist was encrypted and sent to customers in binary format, which made it difficult to edit or reverse-engineer the netlist. (A "netlist" is a description of a circuit comprising a list of lower-level circuit elements or gates and the connections (nets) between the outputs and inputs thereof.)

One disadvantage of the hard macro format was that the area of the FPGA encompassed by the hard macro was totally dedicated to the contents of the macro. A customer could not place additional logic in a CLB within the area, or access any signal inside the area unless the signal had an output port defined as part of the hard macro. Further, the area of the FPGA encompassed by the hard macro had to be rectangular. If the logic fit best, or resulted in the fastest performance, in a non-rectangular area, the extra CLBs required to make the area rectangular were wasted. Hard macros did not include routing information.

Another type of module having a fixed size and shape is the Relationally Placed Macro (RPM) from Xilinx, Inc.

RPMs are described in pages 4–96 and 4–97 of the "Libraries Guide"(hereinafter referred to as the "Xilinx Libraries Guide"), published October 1995 and available from Xilinx, Inc., which pages are incorporated herein by reference. An RPM is a schematic that includes constraints defining the order and structure of the underlying circuits. The location of each element within the RPM is defined relative to other elements in the RPM, regardless of the eventual placement of the RPM in the overall design. For example, an RPM might contain 8 flip-flops constrained to be placed into four CLBs in a vertical column. The column of four CLBs can then be placed anywhere in the FPGA.

Relative CLB locations within an RPM are specified using a Relative Location Constraint called "RLOC". RLOC constraints are described in detail in pages 4–71 through 4–95 of the Xilinx Libraries Guide, which pages are incorporated herein by reference. Elements having an RLOC value of R0C0 are located in a given CLB corresponding to the (0,0) coordinate location. The next CLB "below" the (0,0) CLB is designated as R1C0, corresponding to the (0,1) coordinate location. Although the RPM has a rigid size and shape, other logic can be placed within the borders of the RPM. RPMs, like hard macros, do not include routing information.

A hard macro or RPM implementation of a logic module represents a single fixed circuit targeting a specific FPGA architecture. To accommodate even a slight difference in logic or a different FPGA architecture, a new RPM must be created. Therefore, libraries of RPMs are typically large and limited in scope.

Some flexibility has been provided by creating a different type of library module called a parametric module (i.e., a module having one or more associated variable values). One such type of parametric module is described in pages 1—1 to 2–14 of the "X-BLOX User Guide", published April, 1994 and available from Xilinx, Inc., (hereinafter the "X-BLOX User Guide"), which pages are incorporated herein by reference. The X-BLOX™ software tool includes a collection of library modules from Xilinx, Inc. X-BLOX modules comprise schematic symbols that can be added to a schematic representation of an FPGA design, and then parameterized to specify such variables as bit width, initial values, and so forth. The schematic including one or more X-BLOX modules is then translated into a netlist, and the netlist includes instantiations of the X-BLOX modules. Translation software then implements the X-BLOX module as lower-level circuit elements targeted for the Xilinx XC4000 Series FPGA, and includes these elements in the netlist. The netlist is then implemented in the FPGA by standard mapping, placement, and routing software which generates a configuration bitstream.

X-BLOX modules, although customizable, have a predefined shape and size based on the user-defined parameter values. For example, a counter module (called "COUNTER") is typically implemented as a column of CLBs, wherein the number of CLBs involved is dependent on the value of the parameter "COUNT_TO" (which defines the maximum value of the counter). The COUNTER module is described on pages 4–36 to 4–46 of the X-BLOX User Guide, which pages are incorporated herein by reference. While the size of the counter varies according to the value of the parameter COUNT_TO, for a given parameter value the X-BLOX module has a fixed size and shape.

A newer generation of the X-BLOX product is the LogiBLOX™ tool, also from Xilinx, Inc. A LogiBLOX module has similar capabilities to an X-BLOX module with some accompanying advantages, such as the availability of different logical implementations for a single module. For example, by setting a parameter in a graphical user interface, a user can specify that a multiplexer be implemented using tristate buffers driving horizontal interconnect lines, rather than using the default CLB implementation. The LogiBLOX product is described on pages 4-3 and 4—4 of the "CORE Solutions Data Book", copyright 1997, and available from Xilinx, Inc., (hereinafter the "CORE Solutions Data Book"), which pages are incorporated herein by reference.

Another product comprising parametric modules is the LogiCORE™ library and software tool from Xilinx, Inc., which is described on pages 2–3 to 2–4 of the CORE Solutions Data Book, which pages are incorporated herein by reference. One LogiCORE product is the LogiCORE PCI interface module, described on pages 2–5 to 2–20 of the CORE Solutions Data Book, which pages are incorporated herein by reference. The LogiCORE PCI interface product includes a graphical user interface which allows the user to customize a "header" portion of the PCI design. The data entered by the user comprises memory initialization data that is stored in a predefined register portion of the PCI interface design. The data does not otherwise alter the logic of the PCI interface circuit implemented by the module, other than to adapt the module to the target application.

Another LogiCORE product is a set of DSP CORE modules, described on pages 2–21 through 2–91 of the CORE Solutions Data Book, which pages are incorporated herein by reference. The DSP CORE modules are parameterizable VHDL modules. (VHDL is one well-known type of HDL.)

Another parameterizable logic block is described by Karchmer et al in UK Patent Publication GB 2306728 A, published May 7, 1997, entitled "Programmable Logic Array Design Using Parameterized Logic Modules" (hereinafter "Karchmer"), which is incorporated herein by reference. Karchmer describes a programmable logic module in which parameter values are passed down through a module hierarchy from a parent module to child modules placed within the parent.

It is clear that X-BLOX, LogiBLOX, and LogiCORE modules are optimized as independent blocks of logic, not in the context of the entire design. It would be desirable for library modules to be implemented in a manner leading to the optimal complete design, rather than to a conglomeration of separately optimized circuits.

Morphologic, Inc., of Bedford, N.H., reports that they have devised a type of library module which is implemented based on both user-supplied parameters (including bit widths, setup time, clock to Q time, known sizes, shapes, and latencies) and dynamically generated parameters. These dynamically generated parameters include the target FPGA architecture and the type of tile (e.g., CLB or IOB) present in the portion of the FPGA to be occupied by the logic in the module. For example, when a Morphologic register module is targeted, using the Morphologic Floorplanner tool, to a Xilinx XC4000 Series FPGA, the module may be implemented in either a CLB or an IOB. When the Morphologic module is moved within the interactive floorplanner from a CLB area to an IOB area, the register is implemented using IOB input flip-flops rather than CLB memory elements. When moved from one FPGA to another, and the FPGAs have different architectures (for example, the module is moved from a Lucent Technologies ORCA FPGA to a Xilinx XC4000 Series FPGA) the Morphologic module reportedly changes from an implementation directed to the first FPGA architecture to another implementation directed to the second FPGA architecture. When moved from place to place on a single FPGA within the Morphologic floorplanner, the Morphologic module can reportedly change its shape by rearranging sub-modules within the module, if in the new location it would overlap with a previously placed module.

Although a Morphologic module can reportedly adapt to the location in which it is placed during an interactive (i.e., manual) floorplanning step, it would also be desirable to have the ability to optimize a module not only in the context of the shapes of neighboring modules, but also based on the logical interconnections that must be formed between modules. It would be further desirable to have the ability to adapt the shape of a module at the time the design is mapped, placed, and routed, rather than adapting the shape at an earlier time (e.g., in the Morphologic interactive floorplanner or using other prior art methods) and then "freezing" the module so that it is unable to respond to later changes. It would further be desirable to be able to adapt not just the physical structure (the shape), or the target FPGA architecture, but also the logical structure (the way the circuit is logically implemented) in response to the requirements of other modules.

When hierarchy is imposed using hard macros or RPMs, locally optimized solutions are created, because placement of elements within modules is without reference to spatial or timing requirements of neighboring modules. Therefore, it would be desirable to have the ability to alter a module at the time the design is mapped, placed, and routed, based on the various requirements of the complete design.

SUMMARY OF THE INVENTION
Self Implementing Modules

The invention provides parametric modules called Self Implementing Modules (SIMs) for use in programmable logic devices such as FPGAs. The invention further provides tools and methods for generating and using SIMs. SIMs implement themselves at the time the design is elaborated, i.e., when the SIM code (now in the form of compiled code) is executed, usually when the design is mapped, placed, and routed in a specific FPGA. (Modules implemented in a programming language are first compiled into executable code, then, in a second step, executed or elaborated to produce a netlist and, optionally, placement and/or routing information.)

SIMs target a specified FPGA according to specified parameters that may, for example, include the required timing, data width, number of taps for a FIR filter, and so forth. SIMs are called "self implementing" because they encapsulate much of their own implementation information, including mapping, placement, and (optionally) routing information. Therefore, implementing a SIM-based design is significantly faster than with traditional modules, because much of the implementation is already complete and incorporated in the SIM. SIMs are relocatable anywhere in an FPGA CLB array. They are also well-suited for use in reconfigurable computing systems, wherein most of a programmed IC remains operational while a portion of the IC is reconfigured. One or more SIMs can be regenerated with new parameter values and downloaded to such a reconfigurable IC. In one embodiment, the SIMs are not parameterizable.

SIMs can be hierarchical, i.e., they can include other SIMs, thereby forming a logical hierarchy. In addition, SIMs can include a separate physical hierarchy which is imposed in addition to the logical hierarchy. SIMs therefore offer the advantages of hierarchical design. In some embodiments, SIM parameters are passed down through the hierarchy from a given "parent" SIM to its sub-SIMs, or "children".

In addition to storing logical and physical structural information (e.g., hierarchical groupings) a SIM has an embedded object (or a reference to such an object) called a "Planner". A Planner object is a floorplanner that algorithmically computes the physical locations of the SIM's constituent sub-SIMs. A floorplanner's algorithm can range from the simple algorithm "assign locations according to a single pre-defined footprint", to complex algorithms such as "perform simulated annealing on the constituent SIMs". A SIM with a context-sensitive floorplanner algorithm is able to adapt its placement to its environment by way of mutable shape and/or I/O port locations.

In addition to optimizing the physical structure, the logical structure of the SIM can also be optimized. SIMs within a design can interact with each other to change either or both of the physical and the logical structures of each SIM to reach the optimal result for the design comprising the entire group of SIMs. For example, in a SIM representing a multiplier, a chosen algorithmic implementation of the multiplier can depend on the size of the area available for the SIM (based on feedback from other SIMs) and the permissible delay through the SIM (based on the amount of time allotted to the SIM from the total available time for the complete design). When timing considerations are paramount, a pipelined multiplier implementation can be chosen. When area is the primary consideration, a non-pipelined implementation results due to the area savings of not using register elements. The shape of the implemented SIM is in each case tailored to the shape of the available space, taking into account the needs of the other SIMs in the design.

Because SIMs are preferably implemented using object-oriented software, they are easy both to use and to design. The computer code devices in a SIM may, however, be any interpreted or executable code mechanism, such as scripts, interpreters, dynamic link libraries, Java™ classes, and complete executable programs. (Java is a trademark of Sun Microsystems, Inc.) In one embodiment, all information for the SIM is included in a single Java object, which may reference other Java objects.

SIMs can be transferred from the SIM designer (the person who writes the code) to a SIM user (the person designing the circuit using the SIM) in various ways, such as over a data communications link or stored on a data storage medium. (The term "data communications link" as used herein includes but is not limited to the internet, intranets, Wide Area Networks (WANs), Local Area Networks (LANs), and transducer links such as those using Modulator-Demodulators (modems). The term "internet" as used herein refers to a wide area data communications network, typically accessible by any user having appropriate software. The term "intranet" as used herein refers to a data communications network similar to an internet but typically having access restricted to a specific group of individuals, organizations, or computers. The term "data storage medium" as used herein denotes all computer-readable media such as compact disks, hard disks, floppy disks, tape, magneto-optical disks, PROMs (EPROM, EEPROM, Flash EPROM, etc.), DRAMs, SRAMs, and so forth.

SIMs are easily delivered over a data communications link such as the internet. Therefore, in one embodiment a SIM is protected from duplication or alteration by providing an encrypted SIM that requires a key to decrypt the SIM, using well-known techniques.

Modules Parameterized by Expressions

SIMs are also advantageously adaptable to parametric inputs. In one embodiment, the SIM parameters may be symbolic expressions, which may comprise strings or string expressions, logical (Boolean) expressions (e.g., x AND y, x OR y, x>1), or arithmetic expressions (e.g., x+y), or a combination of these data types (e.g., modulename= basename+".".+((x>1) AND (y+1>5x)), where "modulename" is a string resulting from a combination of string, arithmetic and logical expressions). (The term "string expressions" as used herein means any expression including a character string; therefore every string is also a simple string expression.)

SIMs may have symbolic expressions as parameters; the variables in the expressions parameterizing a SIM are also parameters of the SIM. The variables may also be parameters of the "parent" of the SIM, passed down through the hierarchy to the child SIM.

Parametric expressions are interpreted (parsed and evaluated) at the time the SIM is elaborated. The use of parametric expressions interpreted at elaboration time allows dynamic inheritance (i.e., parameter values specified at elaboration time are passed downward through the SIM hierarchy) and synthesis of actual parameter values, rather than the static value inheritance (i.e., parameter values must be specified at compile time to pass downward through a hierarchy) described by Karchmer and commonly found in programming languages such as C++ and Java.

Including Placement Information in SIMs

Each SIM may include or reference its own implementation information, including physical layout information in the form of a floorplanner. If a SIM does not include or reference a floorplanner, its physical layout is computed by the floorplanner of one of its ancestors in the physical hierarchy (i.e., the SIM's parent or a parent of its parent, etc.). In one embodiment, each floorplanner is implemented as a Java object.

Floorplanners can vary widely in complexity. One simple type of floorplanner chooses from among a plurality of available precomputed placements, depending on the area or timing constraints imposed on the floorplanner. Precomputed placements for this floorplanner could be implemented as a list of RLOC constraints corresponding to the elements in the SIM and designating the relative positions of the elements. Precomputed placements for a given SIM may include, for example, one columnar organization (implemented as a column of elements), one row organization (implemented as a row of elements), one or more rectangular shapes, and so forth. The precomputed placements may all apply to the same logical implementation, or a SIM may include two or more logical implementations for the circuit, and different precomputed placements may apply to different logical implementations.

More sophisticated floorplanners implement more versatile placement algorithms. Such placement algorithms might include, for example: a linear ordering algorithm that places datapath logic bitwise in a regular linear pattern; a rectangular mesh algorithm that implements memory in a grid pattern in distributed RAM; a columnar algorithm for counters and other arithmetic logic; or a simulated annealing algorithm for random logic such as control logic. Therefore, in a design including more than one SIM, the design can include two or more SIMs (at the same or different levels of hierarchy) using different placement algorithms. The design as a whole can therefore utilize a non-uniform global placement strategy, a technique that is not practical using prior art methods.

In one embodiment, the user can specify a particular floorplanner to be used for each SIM. The floorplanner can, for example, be specified by attaching a floorplanner object or a parameter to the SIM. In another embodiment, the user specifies a physical area of the target device (e.g., in an interactive floorplanner) where a given floorplanner is to be used, and identifies SIMs to be placed within that area. SIMs placed within that area then automatically use the floorplanner assigned to that area. In another embodiment, a SIM has a default floorplanner that is used if no other floorplanner is specified for the SIM.

In one embodiment, the user can specify a plurality of floorplanners to be applied to different portions of a single FPGA. Where more than one floorplanner is present in a design, the floorplanners may be active simultaneously, and may communicate with each other to implement the SIMs in a fashion that leads to the most desirable overall solution. The most desirable solution is determined by the user, who specifies timing and spatial requirements using known methods such as attaching parameters to a module or setting software options. The ability to run multiple floorplanners simultaneously speeds up the implementation process, due to the parallel processing of the placement task. In other words, this embodiment applies the well-known divide-and-conquer strategy to physical layout of an FPGA design.

This aspect of the invention is also useful in that a user has the option of writing his or her own floorplanner, thereby implementing his or her own placement algorithm, instead of (or in addition to) specifying one of an existing set of floorplanners.

In one embodiment, the floorplanner can also receive placement information (e.g., from a constraints file or an interactive floorplanner) specifying areas of the target device that are "off limits" to the floorplanner. This ability is useful, for example, when certain portions of a programmable device have been tested and found defective. By specifying and avoiding these defective areas of the device, the rest of the device can still be utilized. The same methods can be used to reserve areas of the target device to be occupied by other modules or elements. Non-SIM elements are easily integrated into a SIM environment using a "black box" interface.

Routing by Abutment

The invention also provides a method that can be used to include routing information in SIMS. According to this method, routing information is specified in such a manner that the routing between modules, however parameterized and elaborated, occurs by abutment of the modules.

In one embodiment, a SIM automatically places and interconnects child SIMs in a mesh pattern. The mesh is a 2-dimensional object corresponding, for example, to an array of CLBs on an FPGA. In essence, this embodiment allows a SIM to reserve routing resources on a target device (e.g., an FPGA), and allocate these resources to its child SIMs. Using a defined protocol, each child SIM can request and reserve routing resources, as well as placement resources (e.g., flip-flops and function generators), through the parent SIM. The routing resources are not limited to local or nearest neighbor routing.

BRIEF DESCRIPTION OF THE DRAWINGS

The present invention is illustrated by way of example, and not by way of limitation, in the following figures, in which like reference numerals refer to similar elements.

FIG. 2 shows an exemplary partial listing of a SIM called X4keAdderxWReg.

FIG. 4 shows exemplary code for a SIM-related method called addAllParams.

FIG. 5 shows exemplary code for a SIM-related method called checkParams.

FIG. 6 shows exemplary code for a SIM-related method called updateImplementation.

FIG. 7 shows a constructor for a SIM that is specific to the XC4000E™ family of FPGAs from Xilinx, Inc.

FIG. 8 shows an exemplary constructor for a user-defined SIM that extends the Java class ImplementedSim.

FIG. 9 shows an exemplary method body for SIM-related method addAllParams.

FIG. 10 shows an exemplary class constructor that invokes the addAllParams method and creates all the ports of a SIM.

FIG. 11 shows exemplary code for a SIM-related method called setPortWidths.

FIG. 12 provides an exemplary implement method that illustrates the use of the addHDLSim method.

FIG. 13 shows exemplary code for the Java class Output.

FIG. 14 shows exemplary code for the PlaceInfo class.

FIG. 15 shows exemplary code for the Implementation class.

FIG. 16 shows exemplary code for the Constraint class.

FIG. 17 shows exemplary code for the Planner abstract class.

FIG. 18 shows a Planner that cycles through a series of precomputed shapes.

FIGS. 19 and 20 together show a special-purpose linear Planner called "RowPlanner".

FIG. 21 shows a Planner using a simulated annealing algorithm.

FIG. 22 shows a "MetaPlanner" that calls several other Planners such as those shown in FIGS. 18–21.

FIG. 25 shows a Planner for the RISC microprocessor SIM of FIGS. 23 and 24.

FIG. 26 shows an exemplary Java class that implements the Mesh2DSimInterface.

DETAILED DESCRIPTION OF THE DRAWINGS

Figure 1:
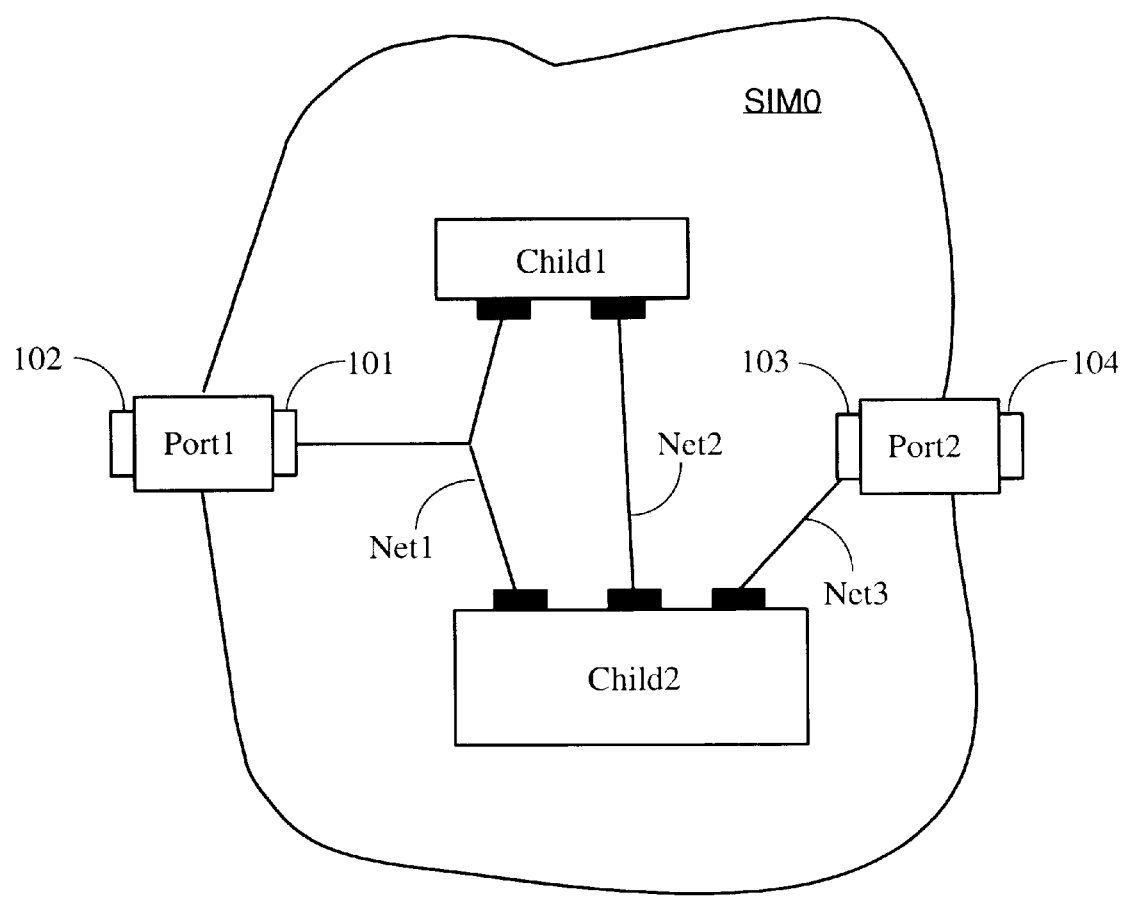
FIG. 1 is a block diagram of a SIM comprising two ports, three nets, and two child SIMs.

Parametric modules, and tools and methods for generating and using such modules, according to the invention are described. In the following description, numerous specific details are set forth in order to provide a more thorough understanding of the present invention. However, it will be apparent to one skilled in the art that the present invention may be practiced without these specific details.

Self Implementing Modules (SIMs)

A SIM is a logical entity that can implement itself on a device (e.g., an FPGA) under the restrictions imposed by the context in which it is used. In the described embodiment, the word "context" refers to the target FPGA device and to other modules (e.g., other SIMs) or other elements that may already be placed on the device. The SIM can incorporate all the knowledge necessary to implement itself within a target device. Moreover, the SIM can interact with other SIMs to achieve an optimal allocation of scarce resources such that the global performance targets are met. These steps occur with minimal user intervention and minimal run-time. In one embodiment, when the self-implementing process has terminated, a bitstream is available to program the targeted device.

SIMs may be parametric in that they implement themselves based on a set of parameters supplied by the user. For example, the user specifies a 32-bit multiplier by setting the appropriate parameter of the multiplier to the desired word length. In one embodiment, SIMs also have the ability to model the behavior, functionality and timing of the logic. Like an HDL representation, a SIM can provide a simulation model that allows the designer to validate functional correctness early in the design cycle.

SIMs are hierarchical, i.e., each SIM can optionally include one or more child SIMs and can be instantiated in a parent SIM. A SIM at the lowest level of hierarchy, i.e., a SIM that cannot be decomposed into constituent sub-SIMs, is called a "primitive SIM". The hierarchy level just above the primitive SIM typically includes all the mapping and placement information (and, optionally, routing information) for the child primitive SIMs.

SIMs speed up the placement process in three ways: 1) placement at the lowest level (the level just above primitive SIMs) is already done; 2) hierarchical placement is used, i.e., a few larger blocks are placed at each of two or more levels instead of placing potentially thousands of small cells at a single level; and 3) a "divide and conquer" strategy is applied at each level, i.e., the placement problem is approached as a series of smaller and faster placement problems.

SIMs can implement large blocks of functionality such as adders, multipliers and FIR filters. Such blocks can be specified as parametric logical entities, and the physical implementation can also be constructively specified in terms of function generators and flip-flops with relative location (e.g., RLOC) constraints. The invention takes advantage of the fact that many sets of such relative location constraints (i.e., many such shapes) are possible for the same logical functionality, thereby increasing the probability that a shape can be chosen to best match the physical implementation context in which the SIM is used. Similarly, many different logical implementations can be used to implement the same circuit. A SIM for which all parameters are specified and a logical implementation has been selected is referred to as an "Implemented SIM". Generally, an Implemented SIM is rendered more usable in the larger context if it provides a plurality of shapes for every logical implementation. Given the logical implementation, the shape most appropriate to the context can be selected.

In one embodiment, all elements in an Implemented SIM are spatially mapped through relational constraints general enough to allow the SIM to be located in most areas of the FPGA to which it is targeted. In another embodiment, rather than specifying specific relational constraints, a floorplanner is referenced that implements the SIM according to a selected floorplanning algorithm. A SIM is said to be "fully implemented" when both a logical and a spatial implementation have been selected, i.e., a logical implementation has been selected and all the elements within the SIM have been placed. A fully implemented SIM may also include some or all of the routing for the SIM.

While an Implemented SIM may optionally include routing information, the Implemented SIM may require that some additional routing be done before the bitstream is generated. The routing depends on the context in which the SIM is placed, thus not all possible routings can always be enumerated in the SIM. While the interconnect fabric of any large FPGA is homogeneous in that it follows a predefined pattern, the interconnect structure typically cannot be segmented into large minimally interacting areas. For example, in an XC4000EX™ device from Xilinx, Inc., long lines span an entire quadrant, and quad lines span four CLB rows or columns but are staggered such that a new line begins at every row or column. However, the local direct interconnect can be used to implement some of the routing local to an Implemented SIM. In some embodiments, for SIMs large enough to require non-local routing, a final post-placement routing phase is necessary to complete the routing. Another embodiment, described below under "Pre-Routed SIMs", includes both local and non-local routing within the SIM.

Detailed Description of a SIM Embodiment

In one embodiment, SIMs are implemented in the Java programming language. However, they can be implemented in any sufficiently powerful programming language.

A SIM includes zero or more ports, nets, and child SIMs. In addition to these elements, in the presently described embodiment every SIM has a reference to a "PlaceInfo" object that holds physical design information. A SIM can also include various optional elements such as parameters or attributes, behavioral models, and implementation methods (e.g., floorplanners) that specify how the SIM is to be constructed. FIG. 1 shows a SIM (SIM0) that comprises two ports (Port1, Port2), three nets (Net1, Net2, Net3), and two child SIMs (Child1, Child2).

In this embodiment, each SIM is defined as a Java class (defined below), and is derived from the class Sim. The base SIM class provides several useful methods for adding or deleting ports, nets, and child SIMs. In Java and other object-oriented languages, a function or procedure is commonly called a "method". The word "method" is also used herein in its traditional sense of a series of steps to perform a task. A Java "class" is a collection of data and methods that operate on that data. A class may also be referred to as a "type". The base class also defines a few abstract methods that have to be made concrete by the final derived SIM. (An abstract method in Java is a method that has no body, just a return type and parameter definition.) Each SIM includes one or more constructors (i.e., Java methods that allocate memory for and typically initialize the variables of a newly created object) which create the ports of the SIM and define the parameters of the SIM.

The class Net allows SIMs to be connected logically. Each net has a width N greater than or equal to one, and is composed of N strands. The SIM user does not create or deal with strands directly; strands are used internally to implement certain net usage semantics. Nets can be ripped to create smaller nets, and bundled to make wider nets. Nets can also be logically merged with other nets. A net connects to one or more SIMs through the ports. A net can be assigned a logical value for simulation (N logical values if the net is defined to be N-wide). In FIG. 1, net Net1 connects the two child SIMs (Child1, Child2) with each other and with port Port1; net Net2 connects the two child SIMs (Child1, Child2) with each other; and net Net3 connects child SIM Child2 with port Port2.

The class Port provides a mechanism to connect a SIM to a net. Each port has place-holders for two nets: the internal net that connects to the child SIMs; and the external net that connects the SIM containing the port to its parent and siblings, if any. In FIG. 1, port Port1 has an internal connection 101 to net Net1 and an external connection 102. Port Port2 has an internal connection 103 to net Net3 and an external connection 104. The port mechanism ensures that a SIM can be quickly and efficiently connected to or disconnected from other SIMs, without altering the internal data structures of the SIM. All the nets included in a SIM (i.e., the port internal nets and the nets connecting child SIMs) are completely contained in the SIM and are not visible outside. The only way to connect an external net to a SIM is through the port mechanism.

The class Sim defines several methods to help construct SIMs. The methods can be broadly categorized as methods for adding and deleting components (e.g., SIMs, nets, and ports), methods for specifying interconnections between components, methods for obtaining information about a SIM, and action methods that cause the SIM to change its state or structure. Based on the disclosure herein, these methods can be generated without undue experimentation by those of ordinary skill in the art.

Methods for Adding and Deleting Components

The following methods are used to add and delete child SIMs, nets, and ports.

Net addNet(String netName, int netWidth): Creates a new net of width "netWidth" and adds it to the invoking SIM. This method returns a reference (i.e., a pointer) to the newly created net.

Port addPort(String portName, int portWidth, int portType): Adds a new port to the invoking SIM. The parameter "portType" is a statically defined constant in the class Port.

Sim addChildSim(Sim childSim): Adds a child SIM "childSim" to the invoking SIM. The child SIM must be created using its own constructor before it is added to the invoking SIM.

deleteNet(Net someNet): Deletes the net "someNet" from the invoking SIM.

deletePort(Port somePort): Deletes the port "somePort" from the invoking SIM.

deleteSim(Sim someSim): Deletes the SIM "someSim" from the invoking SIM.

Methods for Specifying Interconnections Between Components

The following methods are used to specify interconnections between child SIMs, nets, and ports, and to manipulate internal nets.

boolean connectNet(String portName, Net extNet): Connects external net "extNet" to port "portName"; if port "portName" does not exist, returns false, else returns true. This method is invoked on the child SIMs of the invoking SIM, to connect nets in the invoking SIM to the child SIM ports.

boolean connectPortInternal(Port somePort, Net someNet): Connects a net "someNet" of the invoking SIM to a port "somePort" of the invoking SIM. Both port and net should be non-null and have the same width, else the method returns false.

Net getRipNet(Net net1, int index1): Creates a new net of width=1 which contains the strand at index "index1" in net "net1". This method does not modify net "net1" or the strand at index "index1". Both net "net1" and the new net reference the same strand. The new net is returned to the caller.

Net getRipNet(Net net1, int minIndex, int maxIndex): Creates a new net of width=(maxIndex−minIndex+1)

which references the strands at indices "minIndex" to "maxIndex" (inclusive) in net "net1". The new net is returned to the caller.

boolean equateNets(Net net1, Net net2): Makes nets "net1" and "net2" logically equivalent. Both nets should be non-null and have the same width, else the method returns false. The semantics of equateNets is that of creating an equivalence class of nets. For example, the following code fragment first makes nets a and b equivalent, then makes them both equivalent to net c, and then makes a, b, and c all equivalent to net d.

equateNets(a,b);
// makes nets a and b equivalent.
equateNets(b,c);
// makes b and c equivalent, and consequently, a, b, c
// are equivalent.
equateNets(c,d);
// makes c and d equivalent, and consequently, a, b, c, d
// are equivalent.

Smaller nets can be bundled into a large bus/net using equateNets, by first creating the large bus and then equating portions of the large net to the smaller nets. For example:

Net smallNet1=addNet("small1", 5);
// creates net of width 5
Net smallNet2=addNet("small2", 5);
// creates net of width 5
Net largeNet=addNet("largeNet", 10);
// creates net of width 10
equateNets(getRipNet(largeNet,0,4), smallNet1);
equateNets(getRipNet(largeNet,5,9), smallNet2);
// largeNet is now equivalent to a bundle containing the
// two small nets Methods for Obtaining Information about a SIM The following methods can be invoked on a SIM to return selected information about the SIM to the caller. The caller could be a SIM that needs information about its child SIMs, or some other tool such as a floorplanner or netlist formatter that needs information about the SIM.

String getName(): Returns the name of the subject SIM instance.

String getHierName(): Returns the hierarchical name of the subject SIM instance. If the subject SIM has a parent SIM, the hierarchical name of the subject SIM is the name of the subject SIM instance, prefixed by the hierarchical name of the parent SIM and "/". Otherwise, the hierarchical name of the subject SIM is the same as its instance name.

int getNumNets(): Returns the number of Nets that are part of the subject SIM. The number returned does not include the nets of the child SIMs, or the external nets connected to the ports of the subject SIM.

int getNumPorts(): Returns the number of ports in the subject SIM. The number returned does not include the ports of the child SIMs.

int getNumSims(): Returns the number of child SIMs in the subject SIM.

Sim getParentSim(): Returns the parent of the subject SIM if a parent is defined, null otherwise.

boolean isPlaced(): Returns true if the subject SIM is fully implemented (i.e., has fixed parameters, logical implementation, and shape) and is placed at some location on a device, otherwise returns false.

boolean isPrimitive(): Returns true if the subject SIM is a primitive SIM. In this embodiment, a primitive SIM represents a basic element that can be placed on an FPGA, such as a function generator or a flip-flop.

Hashtable getAttrib(): Attributes are key-value pairs, stored in a hashtable. This method returns the hashtable of attributes to the caller.

Netlist getNetlist(): Returns a Netlist object containing a flattened netlist representing the subject SIM. Every SIM in the flattened netlist is a primitive SIM. Every net in the flattened netlist has a width of 1. Netlist objects are used by various computer aided design (CAD) tools.

PlaceInfo getPlaceInfo(): Returns a PlaceInfo object associated with the subject SIM, describing the physical location of the SIM within a particular FPGA.

An "enumeration" is a Java language construct that provides a uniform interface for iterating (stepping one by one through) all the elements in a collection of objects. The following three methods return enumerations of nets, ports and child SIMs of the subject SIM.

Enumeration netElements(): Returns an enumeration of the nets of the subject SIM.

Enumeration portElements(): Returns an enumeration of the ports of the subject SIM.

Enumeration simElements(): Returns an enumeration of the child SIMs of the subject SIM.

Action Methods

The following methods cause the SIM to change its state or structure.

abstract void implement(String deviceFamily, int row, int col, String extraSite): Causes the SIM to create or modify its structure, as necessary, to suit the context defined by the parameters. The implement method is abstract in the base SIM class, so each SIM defines a concrete implement method that does the following:
1) defines the structural netlist for the subject SIM in terms of other SIMs;
2) optionally defines the relative placement of one or more of the SIMs within the subject SIM;
3) optionally defines the placement of the subject SIM either relative to its parent, or in absolute coordinates; and
4) optionally sets a "placed" flag for the subject SIM.

The concrete implement method may be called repeatedly, as when a floorplanner tries to place the SIM in various locations.

void setName(String instanceName): Sets the instance name of the SIM to "instanceName".

void setPrimitive(boolean value): Marks the SIM as Primitive if "value" is true, not Primitive if "value" is false.

Parameters and Expressions

SIMs can be defined in terms of parameters provided by the SIM user. For example, the entire structure of an adder can be described in terms of a parameter "width", representing the widths of the inputs and outputs of the adder; therefore all bus widths, loop counters, etc. in the code are parametric. These parameters are similar to the function/subroutine parameters in programming languages such as C or Java. Such programming languages allow the user to define a function header such as "adder(int width)", with the formal parameter "width". The function body uses the symbolic variable "width" in various computations. The actual value of "width" is known only when the user invokes the adder function (e.g., "adder((widthA+widthB−widthC)*2+1)"), causing the algebraic expression to be evaluated and the value to be placed in the parameter "width" before executing the function body.

While SIMs can be completely defined and used in the form of Java programs, classes, and methods, SIMs may also be specified, created, and used through schematics or HDL-style languages. When a SIM is used in a schematic editor, it is first instantiated, its parameters are assigned values, and its ports are then interconnected to other ports of other SIMs. The instantiated SIM is considered to be a child SIM of the SIM represented by the schematic drawing. The parameters of the child SIM can be defined either as constants or as expressions involving the parameters of the parent SIM. The user can attach new parameters to a SIM. The class ParametricSim extends the basic SIM class to provide the ability to add and evaluate parameters. The following parameter types and methods are supported: Integer, Float, Double, Boolean, String, Choice, FileName, and Vector. Each parameter type has associated add, get, and set methods of the form:

void addParam(String name, <type> value);

For example: void addParam(String name, int value);

<type> getParam<type>(String name);

For example: int getParamInt(String name);

void setParam(String name, <type> value);

For example: void setParam(String name, int value);

The Integer, Boolean and String parameters have an additional "add" method that takes a string expression instead of a value, and their setParam method has a third argument, as in the following examples.

void addParam(String name, <type> defaultValue, String expression);
    void setParam(String name, <type> defaultValue, String expression);

The expression string for Integers is any valid Java integer expression comprising constants and/or variables, with the variables being the names of other parameters of the SIM or its parent (if a parent is defined). Similarly, the expression string for Booleans is any boolean-valued Java expression with the same restrictions as the Integer expression. String expressions have the syntax of Java String expressions. All of these expressions are stored in symbolic form, and are interpreted as late as possible in the elaboration process.

The Choice parameter contains a Java Vector (i.e., an indexed dynamic array) of arbitrary objects, and an index to indicate which one of the objects in the vector is selected. Choice parameters are similar to enumerated types in programming languages.

The Vector parameter contains a Vector of objects, and allows SIM designers or users to specify a coefficient list or an array of memory initialization values as parameters.

The FileName parameter is an extension of the string parameter, where the string represents a file name. Schematic tools can take special action on a FileName parameter, such as presenting a file browser to enable the user to select the appropriate file name.

All the variable names used in parameter expressions are either the names of other parameters of the same SIM, or the names of parameters of the parent SIM, if a parent SIM exists. In this embodiment, variable names should not contain the special character "$", as this character is prefixed to a variable to indicate that it is a parameter of the parent SIN.

Example SIM

FIG. 2 shows a partial listing 200 of a SIM called X4keAdderxWReg, which illustrates some of the concepts discussed above. In particular, in the example of FIG. 2 it is seen that the width of the adder is established only when an instance of class X4keAdderxWReg is actually instantiated, by calling the constructor of this class. Therefore, the adder implementation is independent of the adder width. The listing shows three ports, "a", "b", and "sum". The listing also shows two internal nets, "cy" and "clsum". One or more instantiations of SIM "CY4" are then added, the number of child SIMs incorporated depending on the "sampleWidth" width parameter set when the adder SIM is instantiated. In this example, CY4 is a carry logic module for Xilinx XC4000 Series FPGAs and is set to functional mode "ADD-FG-CI". Partial listing 200 illustrates static parameter passing as implemented in programming languages such as Java or C. For example, in FIG. 2, the "sampleWidth" parameter is passed from parent SIM x4keAdderxWReg to child SIM CY4 through an expression (e.g., sampleWidth-2*i-1) that is parsed when SIM x4keAdderxWReg is compiled, at which time the expression must be fixed. Dynamic parameter evaluation is described later with respect to class ParametricSim.

SIM Interfaces

An "interface" is a Java language construct comprising a collection of methods with specific signatures. Any class can implement these methods (with the same signatures) in some way that is appropriate for the class. A class that implements all the methods of an interface definition is said to implement that interface. SIMs can choose to implement a variety of interfaces to make themselves more useful in different contexts. For example, a SIM can implement both a CustomizerInterface to allow a schematic editor or some other tool to query and set the parameters of the SIM, and a SimulatorInterface to provide a behavioral or structural simulation model. The following are some of the more useful interfaces for a SIM designer or tool builder.

CustomizerInterface: Allows tools to query and set the parameters of a SIM. The CustomizerInterface includes three methods:
    1) Vector getParams(): Allows an external agent (for example, an external tool or another SIM) to get a Vector of all the parameters of the subject SIM.
    2) void setParams(Vector): Allows an external agent to set the values of all the parameters of the subject SIM.
    3) Panel getCustomizerPanel(): Allows an external agent to display a graphical panel produced by the subject SIM to obtain user input. If this method returns null, the external agent uses the first two methods to create a default graphical user interface, and set the values of the parameters.

A standard extension of the SIM class provides a default implementation of the CustomizerInterface.

CustomizerPanelInterface: Allows tools to use a special graphical dialog to query and set the parameters of a SIM.
  DRCInterface: Allows a SIM to perform its own design rule checks in addition to or in the place of certain standard checks performed by a DRC tool.
  SimulatorInterface: Allows a SIM to implement its own behavioral/structural simulation model for use in a compiled code or event driven simulator.

Standard Extensions to SIMs

The SIM package defines five classes that extend the basic Sim class with default implementations of abstract methods, default implementations of certain interfaces, and/or additional methods/variables for extra functionality. The five extended SIM classes described below simplify the work of the SIM designer in commonly encountered usage models for SIMs.

Figure 3:
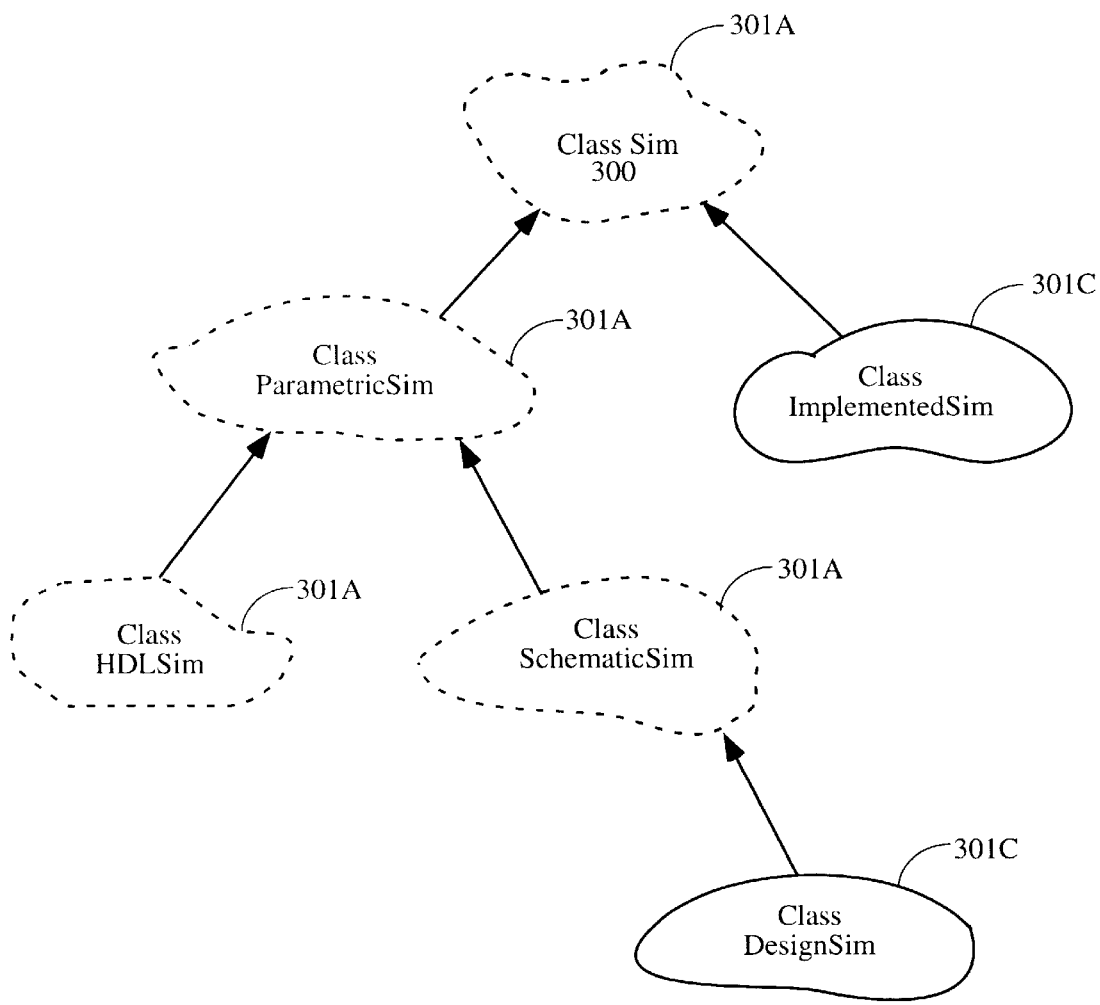
FIG. 3 shows the basic SIM class, the five extended classes, and their inter-relationships.

FIG. 3 shows the basic Sim class 300, the five extended classes 301, and their inter-relationships. In FIG. 3, a class drawn with a dotted line is an abstract class 301A. A class drawn with a solid line is a concrete class 301C. An arrow between two classes means that the class at the base of the arrow extends the class at the head of the arrow.

1) The class ParametricSim extends the basic SIM class by providing methods for storing and accessing parameters of various types. Class ParametricSim provides default methods to implement CustomizerInterface, and adds two new abstract methods that have to be made concrete by the user.
2) The class SchematicSim extends ParametricSim to interface to a schematic editor.
3) The class DesignSim extends SchematicSim by providing trivial implementations of all its abstract methods, and adding some extra fields. This class is designed to be used as a generic or work-space SIM in the schematic editor and other tools.
4) The class ImplementedSim extends the basic SIM class with a default "implement" method. This class serves as the base class for all SIMs whose context and structure (logical structure, not physical structure or placement information) are completely determined at creation time, so a separate "implement" method is redundant. A SIM that extends the ImplementedSim class comprises source code that closely resembles a Java (or any other high level language) program.
5) The class HDLSim extends ParametricSim to provide an interface that is similar to the netlist-building constructs found in hardware description languages such as VHDL or Verilog. In particular, it allows SIM constructors to have no parameters, and allows the user to set individual parameters after instantiating a SIM. After setting all parameters of interest (other parameters take default values) the user invokes a single addHDLSim method that does all the required work.

Class ParametricSim

A parametric SIM has two manifestations, depending on the context in which it is used. When a SIM is used in a schematic editor, the usage model is as follows:

1) The user selects a SIM from the library;
2) A dialog (preferably graphical) is presented to the user to set the parameters of the SIM;
3) The user instantiates the SIM in the drawing;
4) The user connects the SIM to other SIMs in the drawing;
5) Parameter values of the SIM are updated;
6) Connections to the SIM are modified.

Hardware description languages such as VHDL allow a user to instantiate a module as follows:

```
module1 : moduleName
    generic map        ( param1 => value1,
                         param2 => value2)
    port map           ( port1 => signal1,
                         port2 => signal2);
```

The basic sequence of operations when using a SIM in the HDL environment is:

1) The user selects and instantiates a module;
2) The user sets the parameters of the module;
3) The user connects the module to other modules (through signals).

The first four steps in the schematic usage model are similar to the three steps in the HDL usage model, and any SIM that can be used in either environment has to support these operations. The designer of such a SIM has to implement the CustomizerInterface, and provide a constructor that does not require as parameters any of the external nets connected to the SIM. The CustomizerInterface specifies a vector of parameters in the getParams and setParams methods. These parameters are instances of predefined parameter classes such as StringParam or ChoiceParam or DoubleParam. The parameter values are either constants, or expressions involving other parameters of the subject SIM or parameters of the parent SIM of the subject SIM. While each SIM has its own set of parameters, the task of maintaining a set of parameters, presenting them to the user, and updating the values received from the user via the CustomizerInterface is common to all SIMs. The class ParametricSim provides code for performing all these common tasks, leaving the SIM designer with only the task of specifying things that are unique to that SIM.

Class ParametricSim maintains a hashtable of parameters for the SIM, and provides default getParams and setParams methods that get and set values from the hashtable. The ParametricSim class also provides methods for creating and adding new parameter objects to the hashtable, and evaluating parameter expressions to obtain actual parameter values. The SIM designer can therefore create a new SIM by extending ParametricSim, and writing the required constructor and the other methods declared abstract in ParametricSim. These methods include addAllParams and checkParams.

void addAllParams(): Should be invoked in the SIM constructor; should specify all the parameters to be added to the hashtable. FIG. 4 shows example code 400 for the addAllParams method. In example code 400, String, Integer, and Boolean parameters are defined and added using the addParam method. Then, a Vector of choices "Area" and "Speed" is created. The Choice parameter is then added to the invoking SIM by passing the Vector to the addParam method.

String checkParams(): Invoked from the setParams method. This method allows the designer to specify any consistency or error checks on the parameters provided by the user, and to update class variables from parameter values. FIG. 5 shows example code 500 for the checkParams method. In example code 500, the parameter value widthA is checked for compliance with its range conditions (between 2 and 128, inclusive). If widthA is not within its designated range, an error message is generated. Otherwise, the widthA and widthB parameter values are used to define the widths of three predefined ports "inputA", "inputB", and "output". The last few lines of example code 500 set an internal flag "updateImplem" if certain conditions are met.

As earlier mentioned, parameter expressions may be provided to the parametric SIM, instead of fixed parameter values. These expressions are supplied to the running (i.e., executing) instance of the parametric SIM and are not part of the Java code for the parametric SIM. So these expressions are not "static" expressions, as in VHDL or as in the example of FIG. 2. These expressions are parsed and evaluated by the SIM at elaboration time. Since the expressions may reference parameters of the parent SIM, which may also be evaluated at elaboration time, the entire parameter evaluation scoping and inheritance mechanism is dynamic.

Class SchematicSim

The usage model for a SIM used in the context of a schematic editor was described above with regard to the ParametricSim class. Class ParametricSim supports the first four of the six operations of the schematic usage model.

Class SchematicSim extends Class ParametricSim by adding another abstract method, updateImplementation, to support the last two steps of the schematic usage model.

boolean updateImplementation(): Invoked by the schematic editor of one embodiment after setting the parameters of the subject SIM. Allows the SIM to indicate whether the external connections to its ports need to be modified (e.g., if the number of ports has changed, or if the width of some port has changed). FIG. 6 shows example code 600 for the updateImplementation method. In example code 600, the "updateImplem" flag from FIG. 5 is checked. If true, then the existing logical structure of the SIM containing the method is removed and a new logical structure is created.

Class DesignSim

Every user-defined SIM is represented by a unique Java class, but it is sometimes useful to create temporary, generic SIM classes. For example, suppose a schematic editor creates an unnamed SIM to which the user adds structure in the form of child SIMs, interconnecting nets, and various parameters or attributes. A floorplanner or layout editor could group together various SIMs into a larger SIM for defining their placement. The class DesignSim extends Class SchematicSim, and provides default implementations of all the methods declared abstract in its parent class. When the user creates a new schematic drawing, it is stored as a DesignSim object until the user decides to give it a unique class name.

Class ImplementedSim

Class ImplementedSim extends the base SIM class in such a way that the task of the programmer is simplified. In this context, the programmer is a person who creates a new SIM by writing code, instead of using a graphical tool such as a schematic editor. The main difference between the usage model of ParametricSims and ImplementedSims is that the context and the parameters of the ParametricSim are not known at the time the SIM is created, but the context and parameters of the ImplementedSim are known at creation time. The "context" includes the external nets connected to the SIM and the physical device location where the SIM is implemented. Therefore, the ImplementedSim can have a constructor that takes as arguments all the SIM parameters and all nets connecting to the SIM. This approach is similar to the manner in which a VHDL Entity is declared. VHDL separates the generic parameters and the ports, but the ImplementedSim constructor has a single list of parameters containing both the SIM parameters and the nets.

For example, the constructor 700 shown in FIG. 7 is for a SIM that is specific to the XC4000E family of FPGAs from Xilinx, Inc. The example shown in FIG. 7 includes parameters that specify all the connecting nets, as well as the size of the SIM and the connecting nets.

The base SIM class has an abstract method called "implement" that provides parameters such as the device on which the SIM is to be implemented and the location of the SIM on the device. The ImplementedSim constructor already contains all this information so the SIM user does not have to call the implement method separately to create an actual implementation of the SIM. The ImplementedSim class extends the base SIM class by providing a default "implement" method, which can be overridden if necessary to provide special capabilities for the SIM.

FIG. 8 shows an example of a constructor 800 for a user-defined SIM that extends ImplementedSim. The constructor in FIG. 8 first creates all the ports of the SIM using the addPort method, and then creates all the child SIMs using the addSim method, along with the child SIMs' own constructors. The addPort method creates a port that is connected to both the external net passed in through the SIM constructor, and a newly created internal net with the same name as the port. This internal net is returned to the constructor, so all the child SIMs are connected to the internal nets of the subject SIM.

Class HDLSim

Although hardware design languages (HDLs) are similar to high level programming languages (HLLs), there are certain fundamental differences between commonly used HDLs such as VHDL or Verilog, and commonly used HLLs such as C++ or Java. When HDLs are used to build up structural netlists, the biggest of these differences is the ability to use keyword parameters. HDLs allow modules to have a set of generic parameters and ports that can be assigned by name (i.e., by keyword) when the module is instantiated. The order in which the port connections are specified at instantiation time is independent of the order in which the ports were created within the module. In Java or C++, a module constructor has a list of generic, port, and net parameters. These are positional parameters, and the actual parameter list must match the formal parameter list exactly in terms of both "type" and number. The only exception is that trailing parameters can be assigned default values, and can be omitted from the actual parameter list if the resulting signature is still unique. The HDLSim class overcomes this limitation of Java by breaking up module instantiation into multiple steps, each corresponding to setting a single keyword parameter, or a single invocation of the default constructor. As a result, the HDLSim class provides the following HDL features:

1) Name-based connection to ports of a component (similar to VHDL: port map( a => a1) );

2) Name-based parameter setting;

3) Default assignment of constants to port/generic parameters;

4) Use of generic parameters to define port widths; and

5) Extension of library modules with new functionality and/or pins without affecting the calling modules.

Class HDLSim extends ParametricSim, and adds certain generic methods to allow a user-defined SIM to resemble HDL code in gross syntax and semantics. In this embodiment, every HDLSim contains the following methods.

public void addAllParams() {}: Defines all the generic parameters of the SIM. This method is abstract in class HDLSim, and each SIM that extends HDLSim must provide a body for this method. The method body consists of zero or more calls to the "addParam" method provided by ParametricSim. An example addAllParams method 900 is shown in FIG. 9. Three SIM parameters, "inwidth", "num_bits", and "outwidth", are defined.

public <class_name> {}: Class constructor. Invokes the addAllParams method and creates all the ports of the SIM. If port widths are determined by the generic parameters when the module is instantiated, the port widths are set to 0 in the constructor. Example code

1000 for the public class constructor is shown in FIG. 10. The constructor in example code 1000 has no arguments. The constructor creates all the parameters of the SIM in which it is defined. It also creates all the ports of the SIM. However, it does not create the logical or physical structure of the SIM.

public void setPortWidths() {}: Sets port widths at module instantiation time. This method is an abstract method in class HDLSim, and any SIM extending HDLSim must provide a body where generic parameters are evaluated and port widths are set. An example setPortWidths method 1100 is shown in FIG. 11. The setPortWidths method 1100 in FIG. 11 sets the width of the SIM ports "inbits" and "sum" to the values of the SIM parameters "num_bits" and "outwidth", respectively.

public void implement(Family, row, col, site) {}: Builds the logical and (optionally) the physical structure of the SIM. This method is declared abstract in class Sim. The four parameters to this method are the device family on which the SIM is implemented, the row and column on the device where the SIM's reference point is placed, and an extra "site" parameter that can provide a more precise location than just the row and column (e.g., can designate into which function generator in a CLB the element is to be placed).

addHDLSim (HDLSim childSim): Generic method to build the SIM structure. Invokes the setPortWidths method and the implement method on the child SIM, and performs certain other actions to place the child SIM at a particular location on the chip, before adding the child SIM to the parent SIM's list of children. When any SIM instantiates an HDLSim, it first sets all the parameters of the HDLSim, and then invokes this single method to build the structure of the HDLSim.

FIG. 12 provides an exemplary implement method 1200 that illustrates the use of the addHDLSim method. Implement method 1200 first creates an adder SIM called "small_adder", then sets the values of the adder SIM parameters based on input arguments specified for the implement method. The addHDLSim method is then invoked to build the logical and physical structure of the adder. The ports of the adder are then connected to the ports of the invoking SIM.

Helper Classes and Methods

The described embodiment of the invention includes additional classes and methods to support SIM functions. These classes and methods include:

1) netlister classes that support reading a netlist or generating a SIM output in the form of a netlist (e.g., XNF, EDIF, structural VHDL);

2) a placement object that holds information related to the actual physical implementation of the SIM; and 3) design rule and error-checking methods.

SIM designers, SIM users, and others can create any other helper classes as required, to support the use of various external tools or for other reasons. Netlister, placement, and design rule classes and methods are described in the following three sections.

Netlister Classes and Methods

The SIM data structure models nets as objects with a certain width that are referenced by all the ports that connect to the net. This model provides a compact and efficient representation of the SIM in memory, and simplifies the creation of SIMs. CAD tools such as simulators, placers, and routers sometimes require a netlist that contains only single-width nets, and provides efficient methods to access all the ports and modules connected to a net. Given a SIM, the netlister classes build up additional data structures and provide a convenient interface for the CAD tools. The netlister classes also provide a convenient way to read and write netlist files in various standard formats such as XNF or EDIF. (XNF is the Xilinx Netlist Format from Xilinx, Inc. EDIF is a well-known standard netlist format.)

For example, a SIM can be output in flattened XNF format by writing code that looks like the following:

// code to construct a SIM called ad3

// the output code below:

Output output=new Output(); // create a new Output object output.doXNF(ad3, true);

// tell the output class to print out the SIM in XNF

// format, preserving user defined net names

The Output class 1300 shown in FIG. 13 first creates a netlist using the Netlist class, and then outputs the netlist in the required format. The Netlist class is aware of special requirements of different output formats, such as net-naming conventions.

Placement Information Classes and Methods

Every SIM has an associated PlaceInfo object that is created along with the SIM. The PlaceInfo object holds information related to the actual physical implementation of the SIM. This information includes the type of device on which the SIM is implemented, the tile location (row, column) within the device, and, if applicable, a location within this tile. Tile location information in this embodiment can be specified in either of two forms: absolute tile coordinates on the device, or relative tile coordinates with respect to a designated ancestor of the SIM in the SIM instance hierarchy.

Each PlaceInfo object has an attribute called "hsetType" that determines the coordinate system of the associated SIM (the "peer SIM"). If the hsettype is NONE, the tile location corresponds to absolute device coordinates. If the hsetType is PARENT or OWN, the tile location information is understood to be an offset from the tile location of the nearest ancestor of the SIM whose hsetType is OWN or NONE, if such an ancestor exists. If a SIM has no parent SIM, its hsetType is interpreted as NONE, regardless of the actual hsetType information stored in the PlaceInfo object.

The PlaceInfo class provides methods to query and set the hsetType attributes. Changing the hsetType attribute from PARENT to OWN or from OWN to PARENT can cause the locations of descendant SIMs to be recomputed.

In certain situations, the SIM designer may not be able to provide any placement information for a SIM. In such cases, a flag is set in the PlaceInfo object to indicate that the placement information is not valid. The SIM designer can also mark the location of the SIM as unchangeable, or changeable only under special circumstances. In one embodiment, these capabilities are implemented through a variable called lockval that can take on integer values ranging from "FREE" to "LOCKED", where "FREE" is an integer corresponding to "placement not valid and the SIM is free to move to any location on the device", and "LOCKED" is an integer corresponding to "the SIM has a valid placement and is not free to move on the device", and all values between FREE and LOCKED indicate that the SIM has a valid placement, and can be moved to a different location on the device. This form of indicator is well known in the art of FPGA software engineering.

The PlaceInfo object includes a vector of "implementations" and a vector of "constraints", where "Implementation" and "Constraint" are defined below. A SIM implementation specifies the location of every constituent in the SIM's subtree. (A "subtree" is a hierarchy of child SIMs.) For example, an implementation might comprise a list of RLOC-specified placements for each flip-flop or function generator in a SIM. Alternatively, the implementation might simply comprise a listing of sub-SIMs and their locations. One method for constraining the placement of elements within a SIM is described by Patterson et al in commonly assigned, co-pending U.S. patent application Ser. No. 09/049,598 entitled "Method For Constraining Circuit Element Positions in Structured Layouts", which is referenced above and incorporated herein by reference. Patterson describes a vector-based form of layout in which key words or phrases such as "COLUMN" or "ROW" indicate the manner in which the elements of the module are to be placed.

Example code 1400 for the PlaceInfo class is shown in FIG. 14. Example code 1400 illustrates a PlaceInfo class including a vector of implementations and methods to enumerate and add these implementations. The PlaceInfo class of FIG. 14 also illustrates including a vector of constraints and methods to enumerate and add these constraints.

FIG. 15 shows exemplary pseudo-code for the Implementation class. (An implementation is represented as an object of the Implementation class.) In an actual Implementation class, the curly braces "{}" would enclose actual Java code implementing the constructor and the "restore" method. (The comments delimited by the character strings "/**" and "*/" provide information for the JavaDoc utility, which provides on-line documentation for Java code.)

Constraints on a SIM's layout are stored in objects of the Constraint class 1600 shown in FIG. 16. In the example of FIG. 16, a "RegionConstraint" constraint restricts a SIM's layout to be contained in a rectangular device region, then defines resources within the region that are unavailable to the SIM.

Other related information that can be obtained from a PlaceInfo object includes a list of tiles occupied by the SIM, and the bounding box of the tiles occupied by the SIM.

Design Rule Checking

The class SimDRC provides support for generic design rule checks. Examples of such checks are checks for nets with no drivers, nets with no loads, or SIMs with unconnected pins. In one embodiment, each SIM can override the generic check for unconnected pins to perform a more specific check. For example, a function generator SIM with four inputs does not require any connections on the pins that are not used in the equation implemented by the SIM. In this case the generic connection check would flag an error, but a specific check implemented by the SIM itself can eliminate these spurious error messages. A SIM can implement the DRCInterface to let the SimDRC object invoke the SIM's own DRC method.

Another kind of design rule checking, checking the validity of parameters (both individually and with reference to other parameters), is provided in the checkParams method of the ParametricSim class.

SIM-Based Floorplanning and Placement

The term "floorplanning" is used herein to describe the operation of computing or modifying both a SIM's location and its "shape", i.e., the relative locations of all its descendants.

Traditionally, a design is floorplanned in a sequence of "phases" using distinct algorithms such as min-cut, simulated annealing, or by manual control. According to traditional methods, only one algorithm is invoked at a time, and the algorithm is invoked on the entire design. These methods and algorithms are described by Sangiovanni-Vincentelli in "Automated Layout of Integrated Circuits", pp. 113–195 of "Design Systems for VLSI Circuits", edited by G. De Micheli, A. Sangiovanni-Vincentelli, and P. Antognetti, (hereinafter Sangiovanni-Vincentelli) published 1987 by Martinus Nijhoff Publishers, which pages are incorporated herein by reference.

SIM-based floorplanning is organizationally different from prior methods. Instead of a sequence of algorithms that operate on the design data, the SIM representation itself includes or references algorithms to compute layout. Every SIM in the hierarchy can optionally include one or more methods that floorplan the SIM in context. If a SIM does not include at least one such method, one of its ancestors must include at least one method that lays out the SIM in the context of the ancestor's subtree.

Distributing these layout algorithms throughout the design hierarchy has the benefit of localizing algorithms according to local structure in the design. Because a design hierarchy is often structurally heterogeneous, the most efficient layout approach should be similarly heterogeneous. The approach described herein is especially well-suited for constructive methods when the local structure is well-understood by the designer. Further, this type of distributed layout can speed implementation (compile-time) and improve the final layout. For example, a general algorithm such as simulated annealing is not a particularly efficient way to order the constituents of a complex datapath. (The simulated annealing algorithm is essentially optimization via random search. New placements are chosen at random, then compared to the current placement and either accepted to replace the current placement, or rejected. This random search continues until the placement has converged to a final state that is acceptable based on a specified cost function.) A SIM designer who knows the best layout strategy for a given SIM can embed a special-purpose algorithm within the SIM that utilizes this optimal strategy.

Planner-Based Floorplanning

A Planner is an object that can be attached to a SIM's PlaceInfo object to compute the SIM's floorplan. The floorplan is computed by invoking the Planner's execute method. Because SIMs form a hierarchy and each descendant SIM (i.e., each SIM lower in the hierarchy) may itself have an associated Planner object, planner-based floorplanning distributes SIM layout operations through the hierarchy, as previously described.

Although the application to floorplanning is novel, defining Planners that compute layouts is similar in function to defining methods for geometry management in modern windowing systems such as the "X" windowing system and Java AWT. However, floorplanning constraints and objective functions are far more complex than those associated with windowing systems, hence floorplanning has much greater computational complexity than geometry management.

The Planner approach to floorplanning is extremely flexible, since the SIM designer and user are free to write their own Planners. The public interfaces for SIMs, PlaceInfo objects, and Planner objects allow dynamic reassociation of Planners to SIMs and vice versa, and it is possible for a Planner to traverse a SIM hierarchy however it wishes (top-down, bottom-up, or a combination thereof). A Planner can, in fact, re-associate and invoke different Planners at different hierarchical levels.

In one embodiment, Planner is an abstract class, so Planner objects must be instances of a class that extends the Planner class to implement the abstract execute method. FIG. 17 shows an exemplary Planner abstract class 1700.

A SIM can be associated with a Planner by invoking the setSim(Sim s) method, which also updates the SIM's PlaceInfo object to refer to the Planner. The setPlanner method can be multiply invoked to associate different Planners with a SIM. A planner can call itself recursively. A Planner can also replace itself with another Planner.

Planner Examples

FIGS. 18–25 show several examples of Planners using a variety of algorithms.

FIG. 18 shows a Planner 1800 that cycles through a series of precomputed shapes. The SIM designer or user may have created several implementations and stored them in the SIM's PlaceInfo object. The simple Planner in FIG. 18 cycles through all available implementations, scores each implementation according to a predetermined scoring scheme, and selects the implementation with the best score.

FIGS. 19 and 20 show a Planner called "RowPlanner" that is a special-purpose linear Planner. (The Planner comprises the code 1900 of FIG. 19 followed by the code 2000 of FIG. 20.) For a SIM that implements a data path, the constituents are often laid out in a simple linear arrangement. The Planner in FIGS. 19 and 20 performs the layout of such a structure, placing the constituent SIMs in a row. Note that the constituent SIMs need not be identical, nor of the same size. The analogous column Planner ("ColumnPlanner") is very similar to the row Planner. Further, since sub-SIMs can also have row or column Planners, a SIM can easily be laid out in a slicing floorplan. (Slicing floorplans are described by Sangiovanni-Vincentelli, referenced above.)

A system architect may decompose a design into large functional blocks that will be developed in parallel by different engineering teams. The system architect partitions the design into SIMs, and the device into disjoint regions. A Planner can use simulated annealing to place constituents within one such subregion, as shown in the Planner 2100 of FIG. 21.

Planners such as those shown in FIGS. 18–21 can be invoked sequentially so that the overall context is built incrementally. However, for some designs, by appropriately defining the interface between SIMs and regions, the individual floorplanning problems can be decoupled. In these designs, the different planners can be run concurrently.

Rather than caching multiple implementations, the user (or code) may instead invoke several algorithms on a SIM as shown in the "MetaPlanner" class 2200 of FIG. 22. Using a Planner such as the one in FIG. 22, one could, for example, combine the Planners of FIGS. 18–21 to compute a number of implementations, then cycle through the implementations, keeping the implementation with the best score.

Heterogeneous Planners

Figure 23:
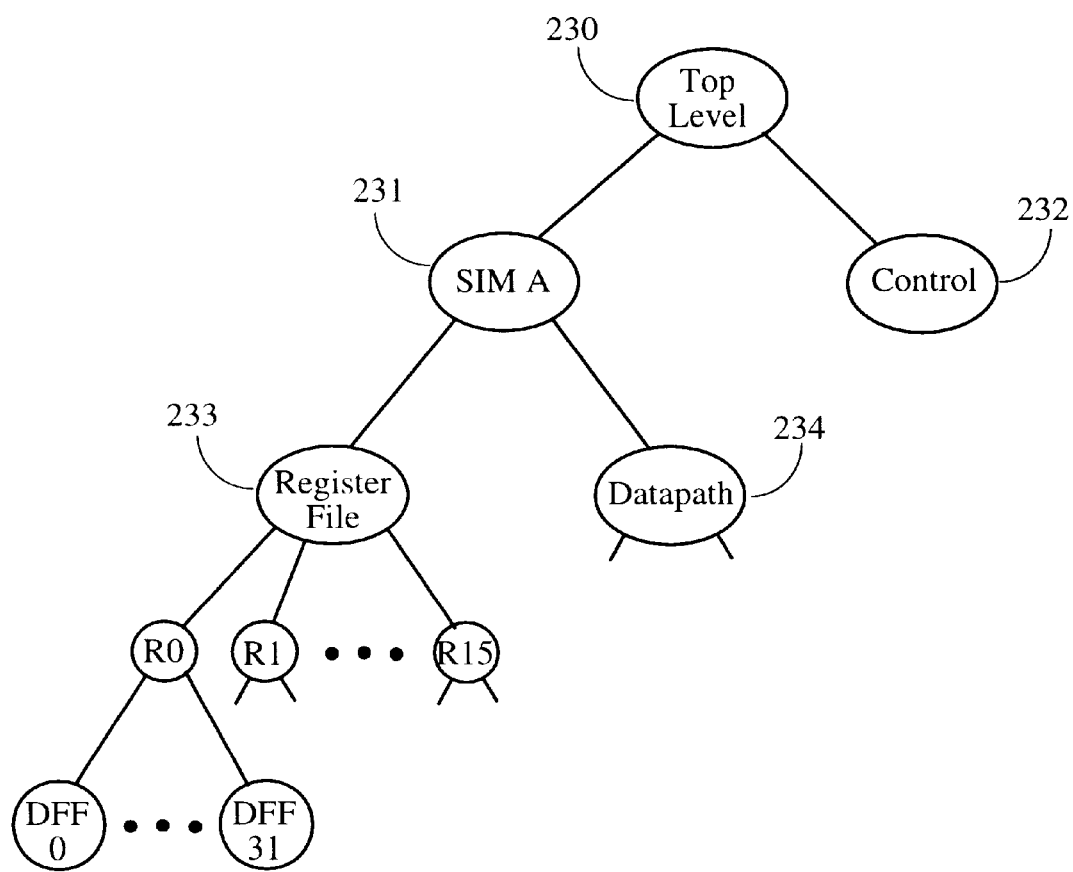
FIG. 23 shows the SIM hierarchy for an exemplary SIM implementing a RISC processor.

FIG. 23 shows the SIM structure for a simple exemplary RISC processor that comprises three main functional blocks: a register file, a datapath, and control circuitry. In this example, the datapath is highly structured and can be described by a slicing floorplan, and the control logic is structurally random (i.e., has no particular structure).

Each functional block in the RISC processor is represented as a SIM. The top-level SIM 230 corresponds to the complete RISC processor, and has two child SIMs, SIM A (231) and a Control SIM (232). SIM A (231) also has two child SIMs, a register file SIM (233) and a datapath SIM (234). The register file SIM (233) incorporates sixteen register SIMs (R0–R15). Each register SIM includes 32 D flip-flops (DFF0–DFF31). The register file and datapath SIMs are grouped together in SIM A partly because they can efficiently use the same layout algorithm.

Figure 24:
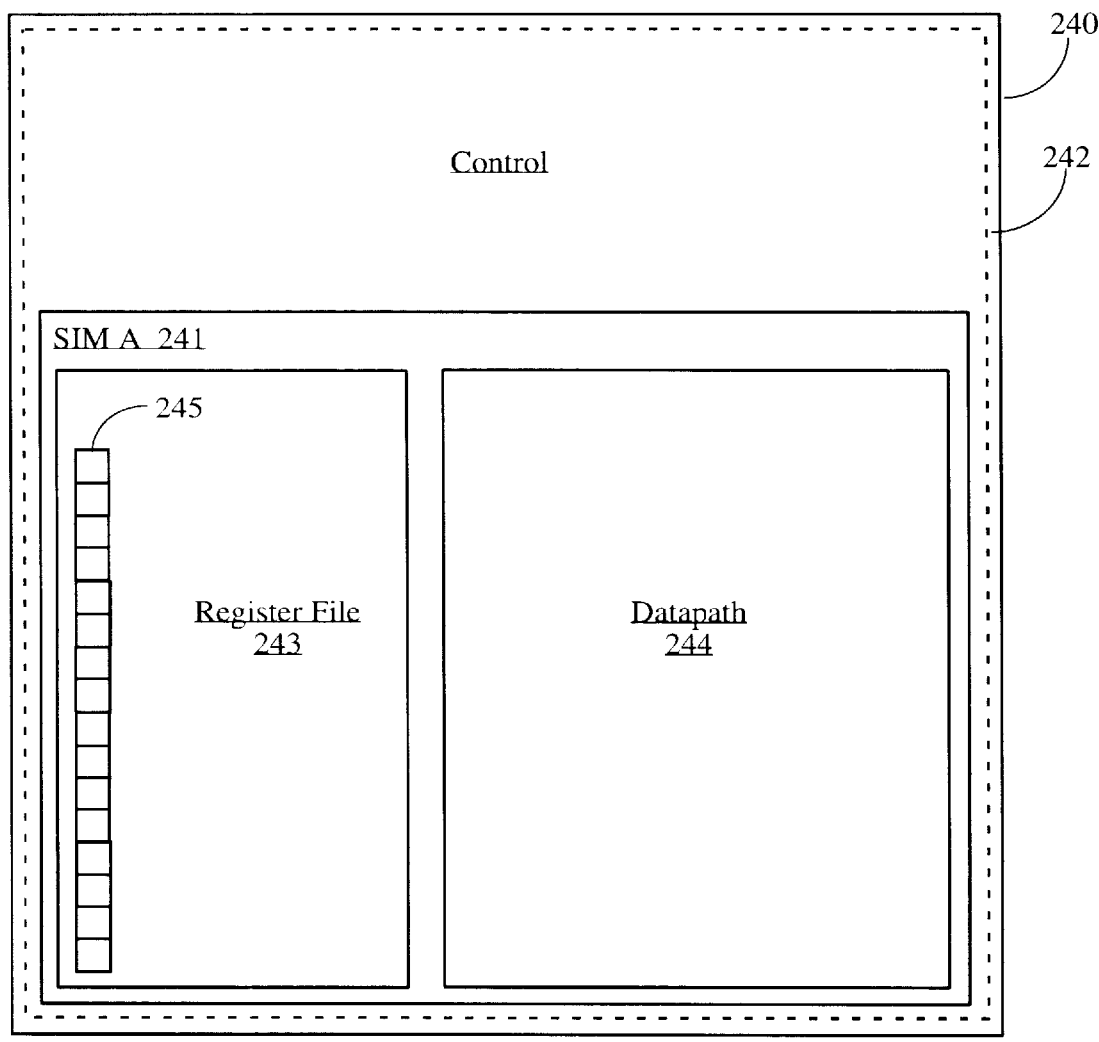
FIG. 24 is a high-level drawing of the RISC microprocessor of FIG. 23 mapped into an FPGA.

FIG. 24 is a high-level drawing of the RISC microprocessor of FIG. 23 mapped into an FPGA. Each register in the register file (SIMs R0–R15) includes or references a ColumnPlanner that stacks the constituent D flip-flops (DFF0–DFF31) in a column 245 as indicated in FIG. 24. The register file SIM includes or references a RowPlanner that places the registers (R0–R15) in a row (not shown). In this manner, register file SIM 233 generates an array structure 243. The datapath SIM's (234) slicing floorplan is computed by a user-specified SlicingPlanner and mapped into a region 244 of the FPGA.

SIM A (231) includes or references a RowPlanner that places the register file sub-SIM to the left of the datapath sub-SIM to create region 241.

Because the control logic is assumed to be structurally random, the Control SIM (232) includes or references an AnnealingPlanner that computes the SIM's layout using a simulated annealing algorithm. (The simulated annealing algorithm is particularly suited to the placement of random logic.) By setting the Control SIM's region constraint to be the entire chip (region 242 in FIG. 24), the annealer can intersperse the control logic with the logic in SIM A if doing so lowers the placement cost.

FIG. 25 shows a Planner 2500 for the top-level SIM (230) of FIGS. 23 and 24. The sequence of calls initiated by the execute method in top level Planner 2500 is as follows:

I) Top-level invokes SIM A's RowPlanner
  A) Sim A Planner invokes Register file's RowPlanner
    1) Register file invokes R0's ColumnPlanner
    2) Register file invokes R1's ColumnPlanner
    . . .
    16) Register file invokes R15's ColumnPlanner
    17) Register file lays out R0–R15 in a row
  B) Sim A Planner invokes SlicingPlanner
    1) SlicingPlanner lays out the datapath.
  C) Sim A RowPlanner lays out datapath to the right of register file.
II) Top-level Planner invokes Control SIM's AnnealPlanner
  A) Control Sim's AnnealPlanner lays out the Control logic Pre-Routed SIMs In one embodiment, all routing is performed by well-known routing tools such as those currently available from Xilinx, Inc. However, another embodiment of the invention allows SIMs to be pre-routed, as is now described.

An FPGA includes a uniform array of tiles, plus global resources that are not part of any tile in the array. Examples of such global resources are clock buffers, configuration logic, or macro blocks such as RAMs and PLLs. Several other resources such as clock lines or long lines are shared by (and can be accessed by) more than one tile. If a SIM at tile location (x,y1) wants to drive a long line passing over that tile, then some other SIM at location (x,y2) might see the same long line, but should not be able to drive it. SIMs can preferably describe their shared-resource requirements using a simple method such as Vector getSharedResourceReq(). A tool that places SIMs together on a device can invoke the getSharedResourceReq method to avoid resource conflicts. For example, when SIMs without routing are used in the context of a shared-resource manager, a SIM requests the manager to give it exclusive use of a shared routing resource, waits for the request to be granted, and (if granted) uses the resource. This concept extends to dynamically reconfigurable systems where the shared-resource manager is the "operating system", which monitors the requirements of the SIMs and swaps them in and out of the device as necessary. In the case of reconfigurable systems, available resources may include not just global routing, but also function generators, registers, I/O ports, and so forth.

The MeshSim concept allows a SIM to automatically place and interconnect child SIMs in a mesh pattern. In one embodiment, the mesh is a 2-dimensional object corresponding to an array of CLBs on an FPGA. In essence, this embodiment allows a SIM to reserve routing resources on a target device (e.g., an FPGA), and allocate these resources to its child SIMs. Using a defined protocol, each child SIM can request and reserve routing resources, as well as placement resources (such as flip-flops and function generators in the CLBs) through the parent SIM. The routing resources are not necessarily limited to local or nearest neighbor routing, but may include interconnect lines spanning several CLBs and/or several mesh rows or columns.

This embodiment includes four important elements:

MeshSim: A SIM having placement and routing resources with a grid-like structure.

MeshElement: A SIM having defined locations for the Ports, and methods for enumerating all the ports on each side of the SIM.

MeshSimInterface: A set of rules (i.e., a "protocol") for a SIM that allows child SIMs to be placed in the MeshSim and automatically connected to resources on the grid.

MeshElementInterface: A set of rules for SIMs that want to obtain resources from the grid.

MeshSimInterface

The following example illustrates a MeshSimInterface in two dimensions, the Mesh2DSimInterface. The Mesh2DSimInterface allows a SIM to automatically interconnect & place child SIMs in a two dimensional mesh pattern. This interface includes five basic types of methods:

1) methods for creating and initializing the mesh;
2) methods for placing a SIM at a mesh location;
3) methods for removing a SIM from a mesh location;
4) methods for updating all the interconnections in the mesh; and
5) methods for selectively updating the interconnections at a particular location.

A SIM either implements all these methods by itself, or simply inherits these methods by extending a Mesh2DSim. ("Extending" is a Java language concept that means inheriting several methods and variables from a "super" or "parent" class, and possibly adding more methods and variables, to form a new class. Mesh2DSim is a 2-dimensional version of a MeshSim. 3-Dimensional and higher versions have applications in the realm of reconfigurable logic.) Once these methods are defined, the elaboration phase of the SIM automatically creates the placement as well as the routing for the subject SIM, as shown in FIG. 26. The exemplary Java code 2600 in FIG. 26 is a partial listing for a class SystolicArraySim that implements the Mesh2DSimInterface. Note the use of methods defined in the Mesh2DSimInterface (initMesh, setElementAt, updateConnections). Within code 2600 is a constructor for the class SystolicArraySim that creates a mesh by invoking an initMesh method also defined in the class (not shown in FIG. 26). Then, the code creates a number of new SIMs ("SomeSim") that are placed within the mesh. The resulting mesh is an array "numRows" high and "numCols" wide. Because the SystolicArraySim class implements the Mesh2DSimInterface, when the "SomeSim" SIMs are added to the mesh they have the ability to reserve global routing resources and to connect to their neighbors by abutment. Finally, all the routing is generated by invoking an updateConnections method also defined in the class (not shown). In example code 2600, the same SIM is placed at each location in the mesh; however, in other embodiments different SIMs are placed at different mesh locations.

MeshElementInterface

Figure 27:
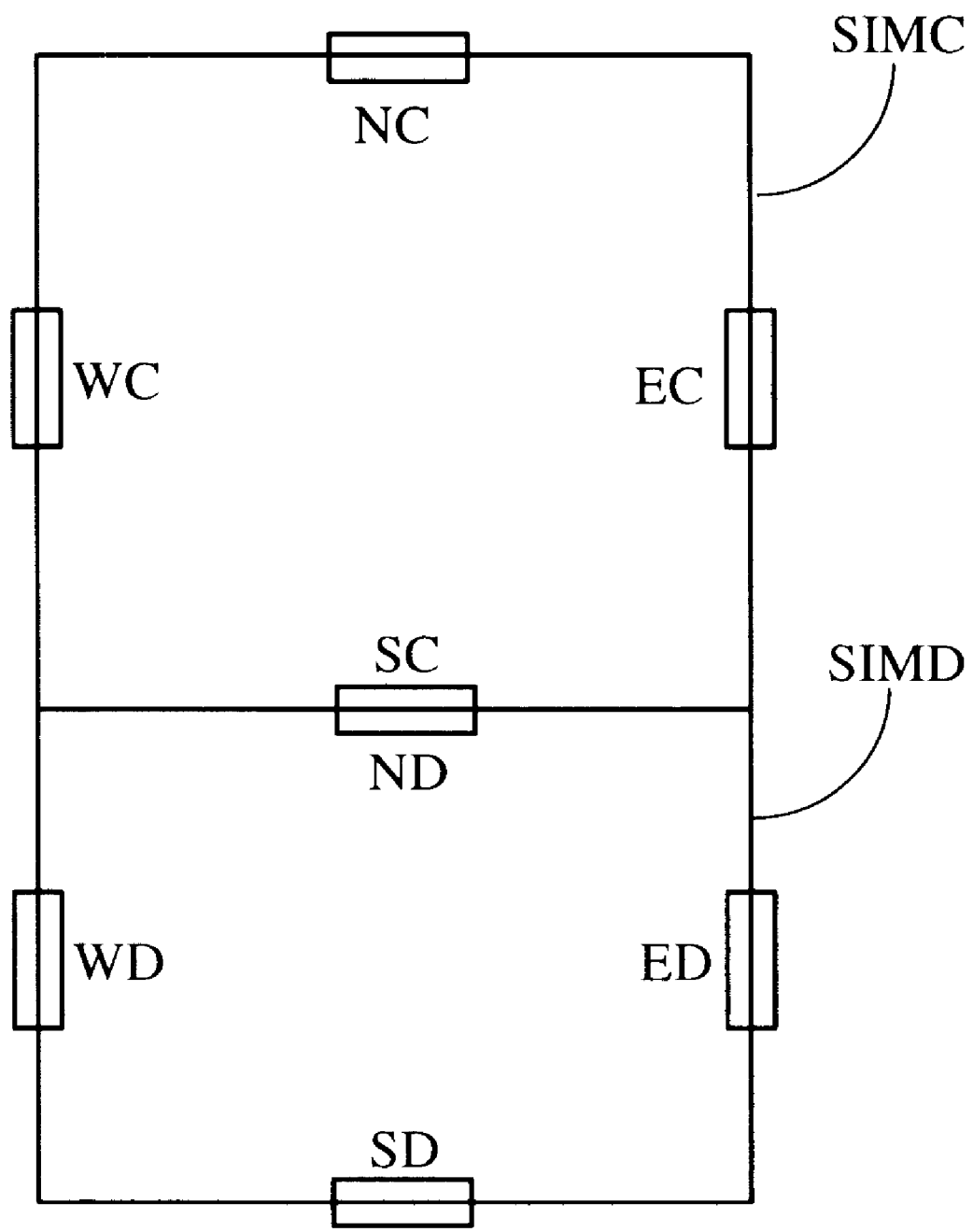
FIG. 27 shows a SIM comprising two child SIMs having a common port, the two child SIMs forming two elements of a mesh structure.

In order for a MeshSim SIM to perform the routing for a child SIM, the child SIM must implement the MeshElementInterface. One version of the MeshElementInterface is the Mesh2DElementInterface. This interface allows the SIM to present a logical and physical view that includes an array of Ports on each of the four sides, optionally including an array of global Ports. For example, FIG. 27 shows two child SIMs (SIMC, SIMD) having a common Port (SC is coupled to ND). (The physical view in FIG. 27 is at a high level of abstraction, and does not correspond to any specific device coordinates.) The Mesh2DSimInterface automatically connects the "Southern" Port SC of child SIM SIMC to the adjacent "Northern" Port ND of the neighboring child SIM SIMD.

The following example illustrates how the Mesh2DElementInterface performs this automatic connection:

1) Mesh2DSim implements the Mesh2DInterface, and has elements SIMC and SIMD at adjacent rows of a single column within the mesh.
2) SIMC and SIMD implement the Mesh2DElementInterface, so the ports on the South side of SIMC get connected to the ports on the north side of SIMD.
3) The clock nets of SIMC and SIMD are connected internally to their global ports so the parent SIM can connect a single clock net to all the child SIMs, irrespective of their physical location in the mesh.

The above text describes the invention in the context of SRAM-based FPGAs. However, the invention can also be applied to other programmable ICs, including antifuse-based FPGAs, mask programmable devices such as Application Specific ICs (ASICs), Programmable Logic Devices (PLDs), and devices in which only a portion of the logic is programmable. Some aspects of the invention are further applicable to non-programmable ICs.

The above text further describes the invention in the context of self implementing modules. However, after reading the present application, it will be clear that many of the structures and methods of the invention can also be applied to logic modules that are not self implementing.

Those having skill in the relevant arts of the invention will now perceive various modifications and additions which may be made as a result of the disclosure herein. Accordingly, all such modifications and additions are deemed to be within the scope of the invention, which is to be limited only by the appended claims and their equivalents.

What is claimed is:

1. A method for determining the placement of logic modules in an IC, the method comprising the steps of:

specifying a first floorplanning algorithm for a first module instantiated in the IC, the first module having an associated first floorplanner using the first floorplanning algorithm;

specifying a second floorplanning algorithm for a second module instantiated in the IC, the second module having an associated second floorplanner using the second floorplanning algorithm, where the second floorplanning algorithm is different from the first floorplanning algorithm;

executing the first floorplanner according to the specified first floorplanning algorithm; and executing the second floorplanner according to the specified second algorithm concurrently with the execution of the first floorplanner, wherein during the concurrent execution the first floorplanner and the second floorplanner exchange information.

2. The method of claim 1, wherein the information exchanged between the first and second floorplanners affects the resulting implementation of at least one of the first and second modules.

3. The method of claim 1, wherein the first and second floorplanners are specified using an interactive floorplanning tool.

4. The method of claim 1, wherein the first and second floorplanners are determined by at least one parameter.

5. The method of claim 1, wherein at least one of the first and second floorplanners is specified as a default floorplanner.

6. The method of claim 5, wherein the default floorplanner is specified within the associated module.

7. The method of claim 5, wherein the default floorplanner is specified in an interactive floorplanning tool.

8. The method of claim 1, wherein the first floorplanner is part of the first module.

9. The method of claim 1, wherein the second floorplanner is part of the second module.

10. The method of claim 1, wherein the second module is a child of the first module.

11. The method of claim 1, wherein the second module has a child module having an associated child floorplanner, further comprising the step of exchanging information between the first floorplanner and the child floorplanner that affects the resulting implementation of at least one of the first and second modules.

12. The method of claim 1, wherein the first and second modules are written in an object-oriented language.

13. The method of claim 12, wherein the object-oriented language is Java.

14. The method of claim 1, wherein the first and second floorplanners are written in an object-oriented language.

15. The method of claim 1, wherein the object-oriented language is Java.

16. The method of claim 1, wherein the IC is a programmable IC and wherein the first floorplanner is specified based on resource constraints in an area of the programmable IC to which the first module is assigned.

17. A data storage medium comprising a first module for a programmable IC, the first module comprising:

a first floorplanner using a first floorplanning algorithm;

a second floorplanner using a second floorplanning algorithm;

means for specifying a logical function of the first module; and means for specifying one of the first floorplanner and second floorplanner that executes at the time the first module is executed, the one floorplanner determining a shape of the first module as implemented in the programmable IC according to the floorplanning algorithm of the one floorplanner.

18. The data storage medium of claim 17, wherein the first floorplanner has the ability to exchange information with other floorplanners associated with other modules.

19. The data storage medium of claim 17, wherein the first floorplanner is written by a module user.

20. The data storage medium of claim 17, wherein the first floorplanning algorithm cycles through a set of precomputed implementations and selects one of the implementations based on a scoring mechanism.

21. The data storage medium of claim 17, wherein the first floorplanning algorithm is a datapath algorithm.

22. The data storage medium of claim 17, wherein the first floorplanning algorithm is a simulated annealing algorithm.

23. The data storage medium of claim 17, wherein the first module further comprises an instantiation of a child module, the child module having an associated child floorplanner.

24. The data storage medium of claim 23, wherein the first floorplanner has the ability to exchange information with the child floorplanner.

25. The data storage medium of claim 17, wherein the first module further comprises the first floorplanner.

26. The data storage medium of claim 17, wherein the first floorplanner further determines a logical implementation of the logical function.

27. A method for determining the placement of logic modules in an IC, the method comprising:

specifying a first floorplanning algorithm for a first module instantiated in the IC, the first module having an associated first floorplanner using the first floorplanning algorithm;

specifying a second floorplanning algorithm for a second module instantiated in the IC, the second module having an associated second floorplanner using the second floorplanning algorithm, wherein the second floorplanning algorithm is different from the first floorplanning algorithm and wherein the first and second floorplanners are determined by at least one parameter;

executing the first floorplanner according to the specified first floorplanning algorithm; and executing the second floorplanner according to the specified second floorplanning algorithm.

28. The method of claim 27, wherein the parameter is chosen based on a global design parameter.

29. The method of claim 27, wherein the IC is selected to be a type of programmable IC and wherein the parameter is chosen based on the type of programmable IC selected.

30. The method of claim 27, wherein the IC is a programmable IC, and wherein the parameter is chosen based on resource constraints in an area of the programmable IC to which the first module is assigned.

* * * * *